(12) United States Patent
Tachibana

(10) Patent No.: US 8,531,840 B2
(45) Date of Patent: Sep. 10, 2013

(54) POWER CONVERSION APPARATUS

(75) Inventor: Hideaki Tachibana, Anjo (JP)

(73) Assignee: Denso Corporation, Kariya (JP)

( * ) Notice: Subject to any disclaimer, the term of this patent is extended or adjusted under 35 U.S.C. 154(b) by 240 days.

(21) Appl. No.: 13/011,244

(22) Filed: Jan. 21, 2011

(65) Prior Publication Data

US 2011/0261600 A1 Oct. 27, 2011

(30) Foreign Application Priority Data

Jan. 22, 2010 (JP) .................................. 2010-012238
Dec. 28, 2010 (JP) .................................. 2010-291492

(51) Int. Cl.
*H05K 7/20* (2006.01)

(52) U.S. Cl.
USPC ............................ 361/699; 361/688; 361/689

(58) Field of Classification Search
USPC ................... 363/146, 147; 361/699, 688, 689
See application file for complete search history.

(56) References Cited

U.S. PATENT DOCUMENTS

| | | | | |
|---|---|---|---|---|
| 6,249,440 | B1 * | 6/2001 | Affolter | 361/769 |
| 6,557,675 | B2 * | 5/2003 | Iannuzzelli | 188/380 |
| 6,597,585 | B2 * | 7/2003 | Ferber et al. | 361/820 |
| 6,654,249 | B2 * | 11/2003 | Gobl et al. | 361/707 |
| 6,791,854 | B2 * | 9/2004 | Shirakawa et al. | 363/147 |
| 6,830,459 | B2 * | 12/2004 | West | 439/63 |
| 6,870,253 | B1 * | 3/2005 | Ushijima | 257/691 |
| 6,885,097 | B2 * | 4/2005 | Maeno et al. | 257/698 |
| 7,352,587 | B2 * | 4/2008 | Schilling et al. | 361/733 |
| 7,561,429 | B2 * | 7/2009 | Yahata et al. | 361/715 |
| 7,764,498 | B2 * | 7/2010 | Conn | 361/699 |
| 7,772,709 | B2 * | 8/2010 | Ueda et al. | 257/787 |
| 7,781,917 | B2 * | 8/2010 | Denney, III | 307/104 |
| 7,978,471 | B2 | 7/2011 | Tokuyama et al. | |
| 2003/0156402 | A1 * | 8/2003 | Ding et al. | 361/820 |
| 2006/0064998 | A1 * | 3/2006 | Funahashi et al. | 62/228.4 |
| 2009/0294195 | A1 * | 12/2009 | Otsuka et al. | 180/65.275 |
| 2011/0228479 | A1 | 9/2011 | Tokuyama et al. | |

FOREIGN PATENT DOCUMENTS

| | | |
|---|---|---|
| JP | P2005-185063 A | 7/2005 |
| JP | 2007-209141 | 8/2007 |
| JP | P2009-71962 A | 4/2009 |
| JP | P2009-219270 A | 9/2009 |
| JP | 2010-119215 | 5/2010 |

OTHER PUBLICATIONS

Office Action (2 pages) dated Nov. 30, 2012, issued in corresponding Japanese Application No. 2010-291492 and English translation (2 pages).

* cited by examiner

*Primary Examiner* — Gary L Laxton
*Assistant Examiner* — Kyle J Moody
(74) *Attorney, Agent, or Firm* — Nixon & Vanderhye PC

(57) ABSTRACT

A power conversion apparatus includes a plurality of semiconductor modules and a plurality of bus bars. The plurality of bus bars include a positive electrode bus bar connected to a positive electrode power terminal, a negative electrode bus bar connected to a negative electrode power terminal, and a plurality of AC bus bars connected to an AC power terminal. Of a DC bus bar group Including the positive electrode bus bar and the negative electrode bus bar, and an AC bus bar group including the plurality of AC bus bars, part of one of the bus bar groups is sealed with insulating resin, and the other of the bus bar groups is not sealed with insulating resin. A seat is formed on the insulating resin sealing the one of the bus bar groups, and the other of the bus bar groups is mounted on a seat face of the seat.

6 Claims, 19 Drawing Sheets

US 8,531,840 B2

POWER CONVERSION APPARATUS

CROSS-REFERENCE TO RELATED APPLICATION

This application is based on and claims the benefit of priority from earlier Japanese Patent Applications No. 2010-12238 filed on Jan. 22, 2010, and No. 2010-291492 filed on Dec. 28, 2010, the descriptions of which are incorporated herein by reference.

BACKGROUND

1. Technical Field

The present invention relates to a power conversion apparatus including a bus bar.

2. Related Art

Conventionally, for example, power conversion apparatuses are known which perform power conversion between DC power and AC power (refer to JP-A-2007-209141). As shown in FIG. 19, the power conversion apparatus is configure by stacking a plurality of semiconductor modules 91 which include a switching element, a plurality of cooling tubes 92 which cool the semiconductor modules 91, and insulating plates which insulate the semiconductor modules from the cooling tubes.

Each of the semiconductor modules 91 has power terminals 93 which conduct electricity to the switching element. A positive electrode power terminal 93a, which is included in the power terminals 93, is connected to a positive electrode of a DC power source via a positive electrode bus bar 95. A negative electrode power terminal 93b, which is included in the power terminals 93, is connected to a negative electrode of the DC power source via a negative electrode bus bar 96.

The positive electrode bus bar 95 and the negative electrode bus bar 96 are made of metal plates, and are placed so as to be opposite to each other with a predetermined distance therebetween in the thickness direction. The positive electrode bus bar 95 and the negative electrode bus bar 96 are fixed by an insulating resin 97. The insulating resin 97 is connected to a metallic storage case, which is not shown.

The power conversion apparatus 90 converts DC voltage applied between the positive electrode power terminal 93a and the negative electrode power terminal 93b into AC voltage by the operation of the switching elements. The power conversion apparatus 90 outputs the AC voltage from AC terminals 93c and 93d.

However, in the conventional power conversion apparatus 90, as described above, both the positive electrode bus bar 95 and the negative electrode bus bar 96 are sealed by the insulating resin 97. Hence, a large amount of resin is required, which raises the manufacturing cost.

SUMMARY

An embodiment provides a power conversion apparatus which can be manufactured at lower cost.

As an aspect of the embodiment, the power conversion apparatus includes: a plurality of semiconductor modules which have a body part incorporating a switching element configuring a power conversion circuit, and in which power terminals, which conduct electricity to the switching element, project from the body part; and a plurality of bus bars to which the power terminals are connected. The plurality of power terminals include a positive electrode power terminal, a negative electrode power terminal, and an AC power terminal, the positive electrode power terminal being electrically connected to a positive electrode of a DC power source, the negative electrode power terminal being electrically connected to a negative electrode of the DC power source, and the AC power terminal being electrically connected to an AC load. The plurality of bus bars include a positive electrode bus bar, a negative electrode bus bar, and a plurality of AC bus bars, the positive electrode bus bar being connected to the positive electrode power terminal, the negative electrode bus bar being connected to the negative electrode power terminal, and the plurality of AC bus bars being connected to the AC power terminal. A DC bus bar group includes the positive electrode bus bar and the negative electrode bus bar, an AC bus bar group includes the plurality of AC bus bars, a part of one of the bus bar groups is sealed with an insulating resin, and the other of the bus bar groups is not sealed with the insulating resin. A seat is formed on the insulating resin sealing the one of the bus bar groups, and the other of the bus bar groups is mounted on a seat face of the seat.

BRIEF DESCRIPTION OF THE DRAWINGS

In the accompanying drawings.

DETAILED DESCRIPTION OF THE PREFERRED EMBODIMENTS

With reference to the accompanying drawings, hereinafter are described embodiments. Throughout the drawings, components identical with or similar to each other are given the same numerals for the sake of omitting unnecessary explanation.

First Embodiment

A power conversion apparatus according to a first embodiment will be explained with reference to FIGS. 1 to 8.

Figure 2:
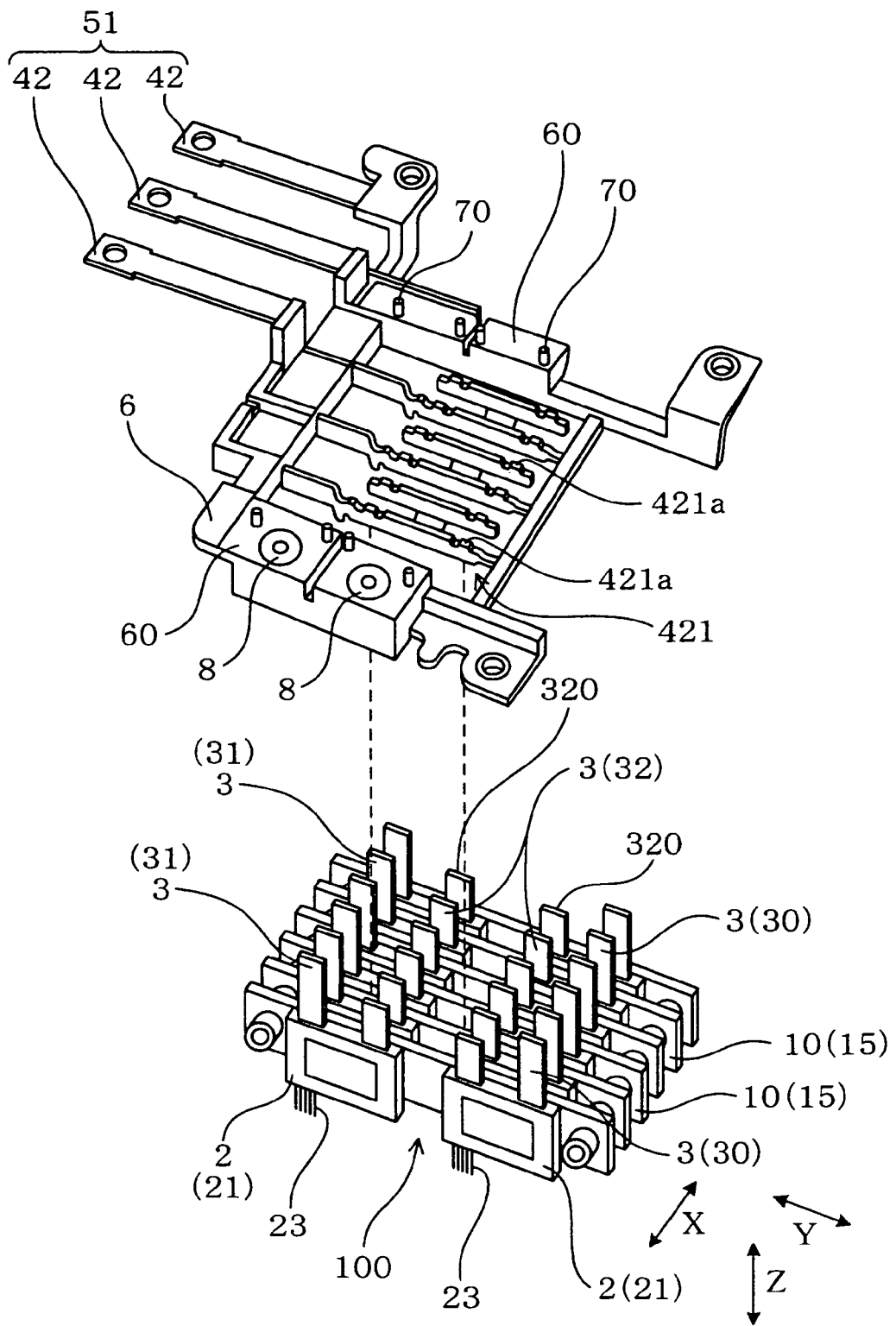
FIG. 2 is a perspective view showing an AC bus bar group sealed with insulating resin and semiconductor modules.

As shown in FIG. 2, a power conversion apparatus 1 according to the present embodiment includes a plurality of semiconductor modules 2 which have a body part 21 incorporating a switching element 20 (refer to FIG. 8) configuring a power conversion circuit, and in which power is terminals 3, which conduct electricity to the switching element 20, project from the body part 21.

Figure 1:
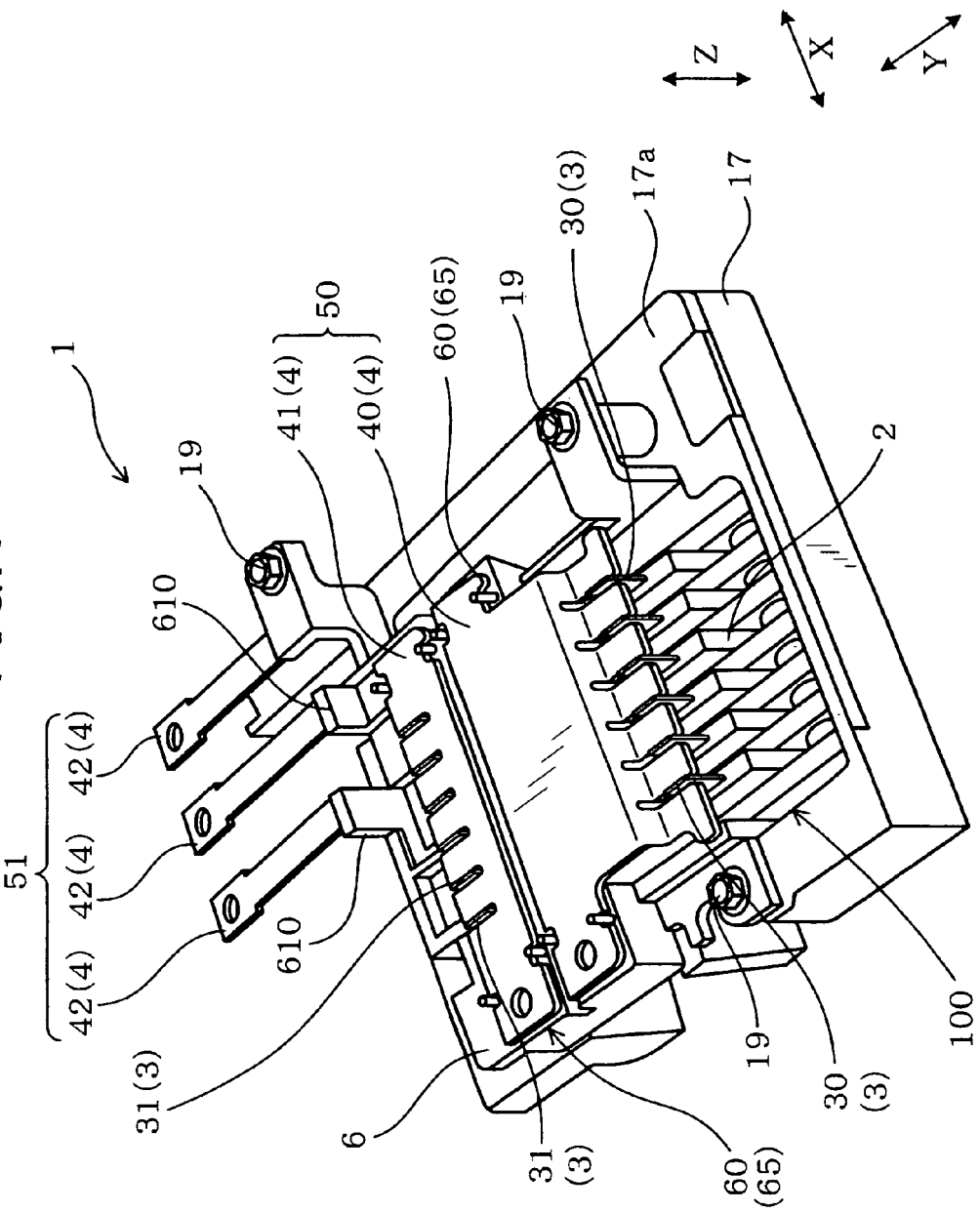
FIG. 1 is an entire perspective view of a power conversion apparatus according to a first embodiment.

In addition, as shown in FIG. 1, the power conversion apparatus 1 includes a plurality of bus bars 4 to which the power terminals 3 are connected.

As shown in FIG. 2, the plurality of power terminals 3 include a positive electrode power terminal 30, a negative electrode power terminal 31, and an AC power terminal 32. The positive electrode power terminal 30 is electrically connected to a positive electrode of a DC power source. The negative electrode power terminal 31 is electrically connected to a negative electrode of the DC power source. The AC power terminal 32 is electrically connected to an AC load.

In addition, as shown in FIG. 1, the plurality of bus bars 4 include a positive electrode bus bar 40, a negative electrode bus bar 41, and a plurality of AC bus bars 42. The positive electrode bus bar 40 is connected to the positive electrode power terminals 30. The negative electrode bus bar 41 is connected to the negative electrode power terminals 31. The AC bus bars 42 are connected to the AC power terminals 32.

As shown in FIGS. 1 and 2, a DC bus bar group 50 includes the positive electrode bus bar 40 and the negative electrode bus bar 41. An AC bus bar group 51 includes the plurality of AC bus bars 42. A part of the AC bus bar group 51, which is one of the bus bar groups, is sealed with an insulating resin 6. In addition, as shown in FIG. 1, the DC bus bar group 50, which is the other of the bus bar groups, is not sealed with the insulating resin 6.

In addition, a seat 60 is formed on the insulating resin 6 sealing the AC bus bar group 51, which is one of the bus bar groups. The DC bus bar group 50, which is the other of the bus bar groups, is mounted on the seat 60.

Hereinafter, detailed explanation is provided.

As shown FIG. 2, the power conversion apparatus 1 of the present embodiment has a stacked body 100 in which the semiconductor modules 2 and refrigerant flow paths 15 are stacked with each other. Refrigerants flow through the refrigerant flow paths 15 and cool the semiconductor modules 2. In the present embodiment, the refrigerant flow paths 15 are formed in cooling tubes 10. That is, the stacked body 100 is configured by alternately stacking the cooling tubes 10 having the refrigerant flow paths 15 and the semiconductor modules 2 with each other. Two semiconductor modules 2 are arranged in parallel in the direction in which the refrigerant flows, that is, in the longitudinal direction of the cooling tube 10 (Y direction) and between the adjacent cooling tubes 10. Each of the semiconductor modules 2 has two power terminals 3 which project in the Z direction orthogonal to the stacked direction of the stacked body 100 (X direction) and the Y direction. A total of four power terminals 3 are arranged in the Y direction. One of the four power terminals 3 arranged at one end is the negative electrode power terminal 31. Another one of the four power terminals 3 arranged at the other end is the positive electrode power terminal 30. The power terminals 3 arranged between the positive electrode power terminal 30 and the negative electrode power terminal 31 are the AC power terminals 32.

In the stacked body 100, two arrays of the semiconductor modules 2 are configured so that two semiconductor modules 2 aligned in the Y direction are repeatedly arranged in the X direction. Accordingly, four arrays of the power terminals 3 are configured so that four power terminals 3 aligned in the Y direction are repeatedly arranged in the X direction.

As shown in FIG. 1, the power conversion apparatus 1 of the present embodiment has a frame 17 having a substantially rectangular shape in a planar view from the Z direction. In the present embodiment, the stacked body 100 is pressed from one side to the other side in the stacked direction (X direction) by using a spring member, which is not shown, whereby the stacked body 100 is brought into close contact with an inner surface of the frame 17. Hence, the stacked body 100 is fixed inside the frame 17. In addition, the insulating resin 6 is mounted on an end face 17a of the frame 17 at the side where the power terminals 3 project. The insulating resin 6 is fastened to the frame 17 with three fastening members 19.

The positive electrode power terminals 30 are electrically connected to the positive electrode of the DC power source via the positive electrode bus bar 40 (refer to FIG. 1). In addition, the negative electrode power terminals 31 are electrically connected to the negative electrode of the DC power source via the negative electrode bus bar 41 (refer to FIG. 1). By the switching operation of the switching elements described above, the power conversion apparatus 1 converts DC voltage into AC and outputs the AC voltage from the AC power terminals 32.

In addition, each of the semiconductor modules 2 includes a control terminal 23 (refer to FIG. 2) connected to a control circuit substrate, which is not shown, and control the operation of the switching elements in response to control signals transmitted from the control circuit substrate.

Figure 3:
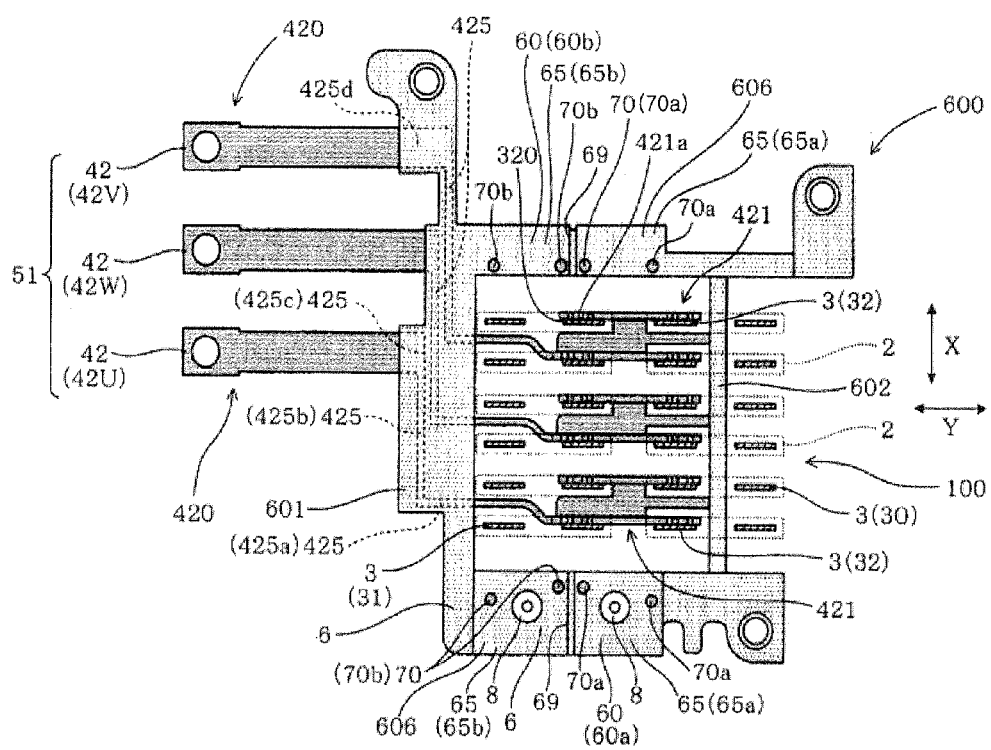
FIG. 3 is a plan view showing an AC bus bar group sealed with insulating resin and semiconductor modules.

As shown in FIG. 3, the AC bus bar group 51 consists of AC bus bars 42U, 42V and 42W which output three-phase AC power. Each of the AC bus bars 42 has an external connecting part 420 to be connected to an external device, and a terminal connecting part 421 to be connected to the AC power terminals 32 of the semiconductor modules 2. Each of the terminal connecting parts 421 is connected to four AC power terminals 32. In the present embodiment, these AC power terminals 32 and the terminal connecting parts 421 are connected to each other by making main surfaces of the AC power terminals 32 and a main surface of the terminal connecting part 421 overlap each other, and welding end faces 320 of the AC power terminals 32 (refer to FIG. 2) and an end face 421a of the terminal connecting parts 421 together.

Note that the main surface indicates the surface having an area which is the largest of surfaces configuring the AC power terminal 32 or the terminal connecting part 421. In addition, the end face 320 is a surface which is orthogonal to the main surface of the AC power terminal 32, and is formed at an end in the projecting direction of the AC power terminal 32. In addition, the end face 421a is orthogonal to the main surface of the terminal connecting part 421 and is orthogonal to the projecting direction of the AC power terminal 32 (Z direction).

In addition, as shown in FIG. 3, the AC bus bar group 51 is sealed with a sealing body 600 made of the insulating resin 6. The sealing body 600 is configured with a sealing part 601, a pair of seat forming parts 606, and a connecting part 602, and is formed in a substantially rectangular frame shape. The pair of seat forming parts 606 is parallel to each other, and extends in the direction perpendicular to the sealing part 601 from the both ends of the sealing part 601. The connecting part 602 connects portions, which are adjacent to the ends of the pair of seat forming parts 606, to each other, the ends being located at the positions opposite to the sealing part 601. The sealing part 601 seals intermediate parts 425 between the external connecting parts 420 and the terminal connecting parts 421 of the AC bus bars 42, thereby electrically insulating the AC bus bars 42U, 42V and 42W from each other, and fixing the AC bus bars 42U, 42V and 42W.

The sealing part 601 is a block body extending in a substantially linear manner and in the X direction in the planar view. The sealing part 601 seals the intermediate parts 425 of the three AC bus bars 42U, 42V and 42W in a state where the intermediate parts 425 are located at a predetermined distance in the X direction. Each of the intermediate parts 425 has a crank shape not only when viewed from the Z direction (the shape shown in the plan view of FIG. 3) but also when viewed from the X direction. That is, the intermediate part 425 includes three bend portions. The intermediate part 425 can be divided into four parts including a first part 425a, a second part 425b, a third part 425c, and a fourth part 425d, via the three bend portions. All the three bend portions are bent at a substantially right angle.

The first part 425a is connected to the terminal connecting part 421 and extends in the longitudinal direction (Y direction) of the refrigerant flow path 15 (refer to FIG. 2). The second part 425b extends in the X direction from the end of the first part 425a opposite to the terminal connecting part 421. The third part 425c extends in the projecting direction of the power terminal 3 (refer to FIG. 1) from the end in the X direction of the second part 425b opposite to the first part 425a. The fourth part 425d bends and extends in the Y direction and toward the outside of the frame 17 from the end at the extending side of the third part 425c. The fourth part 425d is continued to the external connecting part 420.

The sealing part 601 seals the intermediate parts 425 so as to cover all the bend portions between the first part 425a, the second part 425b, the third part 425c, and the fourth part 425d. As shown in FIG. 1, the sealing part 601 includes projecting portions 610 which project in the Z direction. In the projecting portions 610, the third parts 425c are sealed.

Seats 60a and 60b are respectively formed on the two seat forming parts 606 located at both sides in the stacked direction (X direction) of the sealing body 600, the both sides interposing an opening portion, in which the stacked body 100 is disposed, therebetween. In the planar view, the terminal connecting parts 421 are disposed between the two seats 60a and 60b. Both one seat 60a and the other seat 60b are block bodies extending in a substantially linear manner and in the Y direction in the planar view, and are orthogonal to the sealing part 601 which seals the intermediate parts 425 of the AC bus bars 42 and extends in the X direction. One seat 60a and the other seat 60b are formed with seating faces 65 on which the DC bus bar group 50 is mounted. The seating faces 65 are provided at the side, at which the AC power terminals 32 are formed, in the Z direction of the seats 60 of the sealing body 600. The seating faces 65 include positive electrode seating faces 65a, on which the positive electrode bus bar 40 is mounted, and negative electrode seating faces 65b, on which the negative electrode bus bar 41 is mounted. Groove parts 69 are formed between the positive electrode seating faces 65a and the negative electrode seating faces 65b. The groove parts 69 separate the positive electrode seating faces 65a and the negative electrode seating faces 65b from each other.

The connecting part 602 is a block body extending in a substantially linear manner and in the X direction. The connecting part 602 seals and fixes ends of the terminal connecting parts 421 of the three AC bus bars 42U, 42V and 42W in a state where the ends are located at a predetermined distance in the X direction. In addition, the connecting part 602 passes through the spaces between the AC power terminals 32 and the positive electrode power terminal 30.

The terminal connecting parts 421 are located inside the sealing body 600 so as not to project from the seating faces 65 of the seats 60 in the Z direction. In addition, as shown FIG. 4, the DC bus bar group 50 is mounted on and fixed to the seating faces 65 of the seats 60. The DC bus bar group 50 is provided at the side to which the power terminals 3 of the semiconductor modules 2 project with respect to the AC bus bar group 51. The insulating resin 6 has engaging parts 70 which engage with engaged parts 71 formed in the DC bus bar group 50. Engagement between the engaging parts 70 and the engaged parts 71 positions the DC bus bar group 50 on the seats 60.

The engaging parts 70 are projections projecting in the Z direction from the seating faces 65 of the seats 60. The engaged parts 71 are notches formed at a side portion of the positive electrode bus bar 40 or the negative electrode bus bar 41. The insulating resin 6 includes four engaging parts 70a, which are used for positioning the positive electrode bus bar 40, and four engaging parts 70b, which are used for positioning the negative electrode bus bar 41. As shown FIG. 4, respective pairs of engaging parts 70a are formed at both ends in the Y direction of the two positive electrode seating faces 65a so that a total of four engaging parts 70a can position the positive electrode bus bar 40. In addition, respective pairs of engaging parts 70b are formed at both ends In the Y direction of the two negative electrode seating faces 65b so that a total of four engaging parts 70b can position the negative electrode bus bar 41.

As shown in FIG. 3, a pair of engaging parts 70 of each of the seating faces 65 of the other seat 60b is arranged in the Y direction in parallel. A pair of engaging parts 70 of each of the seating faces 65 of one seat 60a is arranged so that the pair of engaging parts 70 is offset from each other in the X direction.

Figure 4:
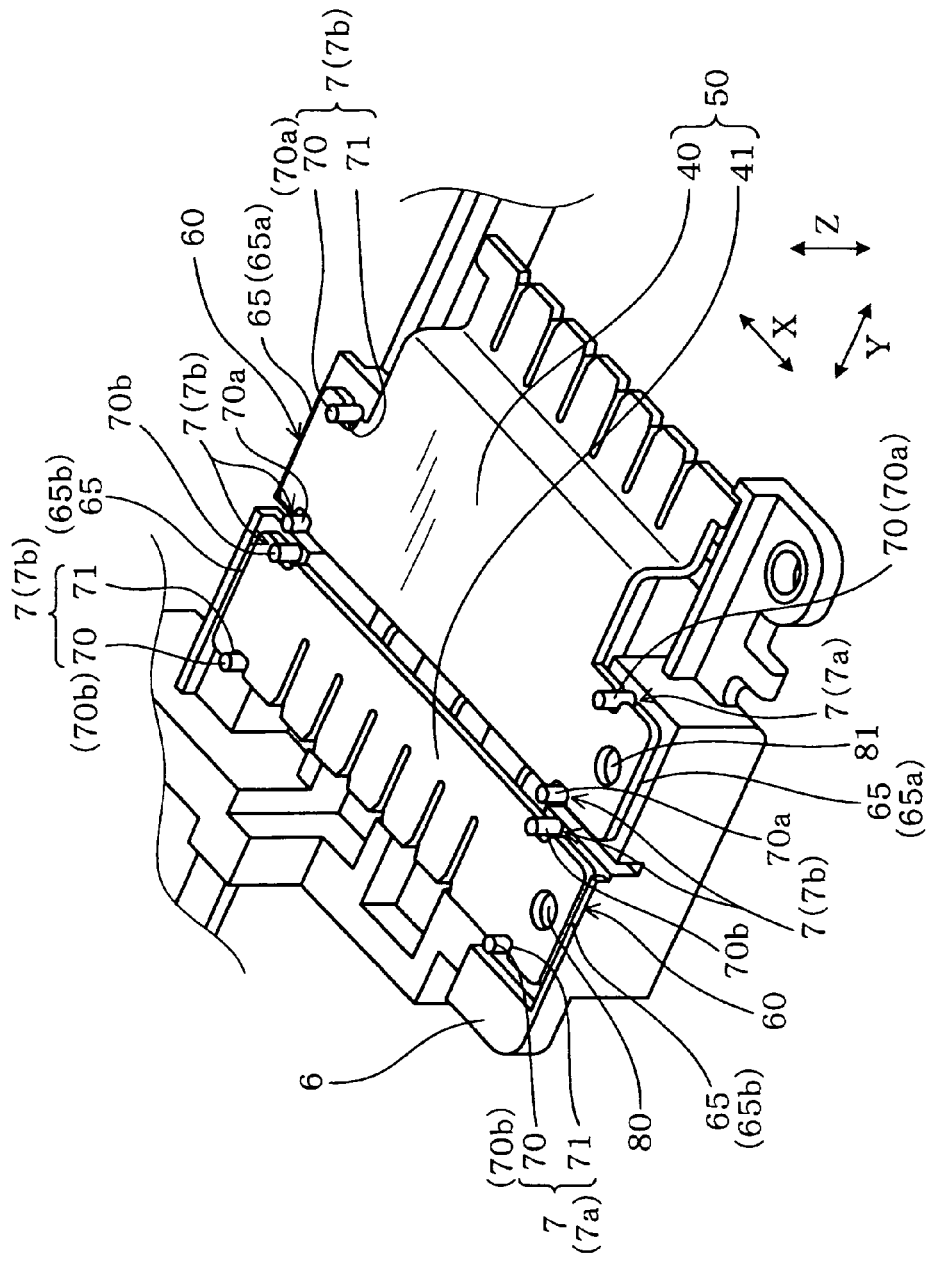
FIG. 4 is an enlarged perspective view of a state in which DC bus bars are mounted on a seat formed of insulating resin, according to the first embodiment.
Figure 5:
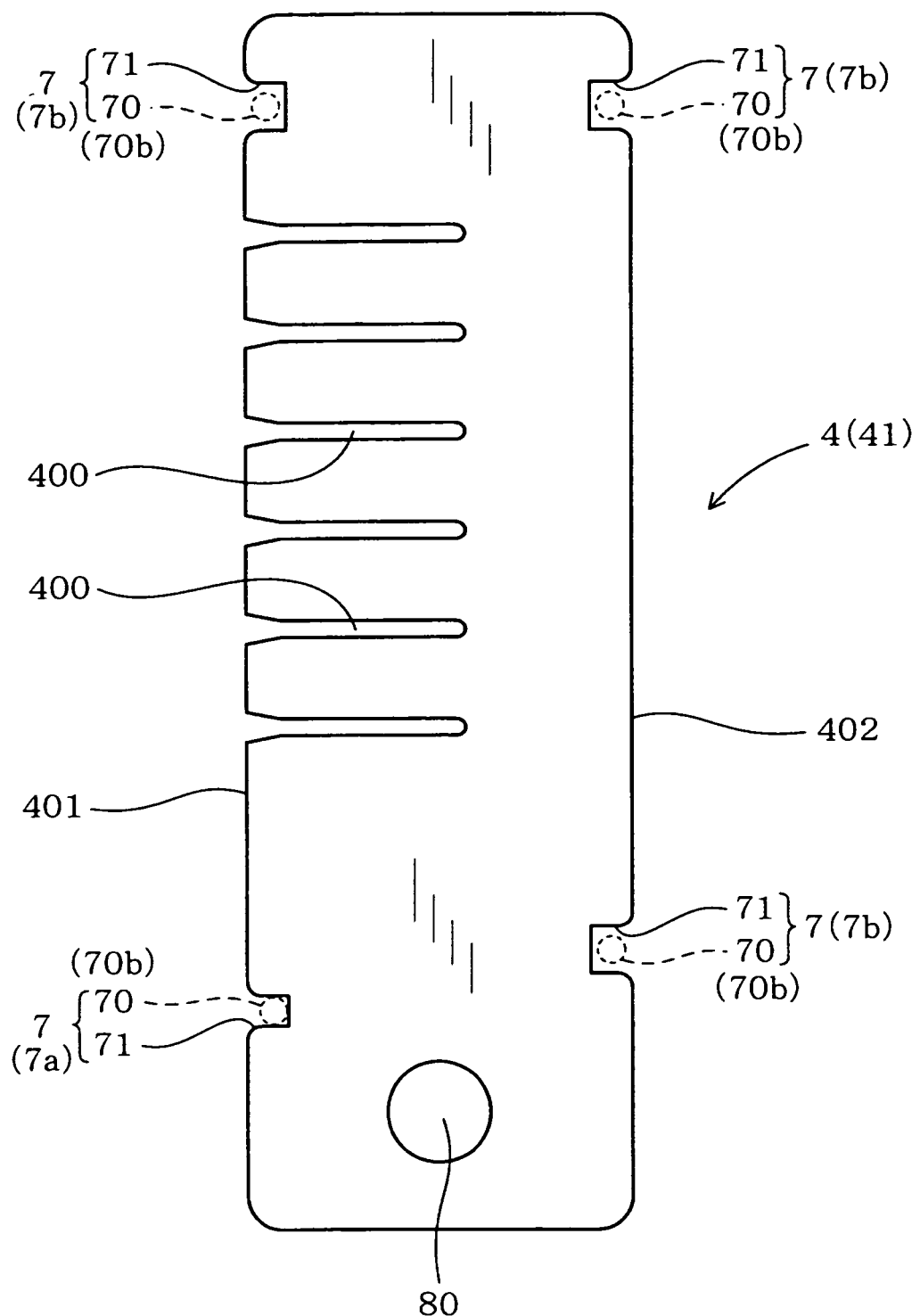
FIG. 5 is a plan view of a negative bus bar according to the first embodiment.

As shown in FIGS. 4 and 5, a part of a plurality of positioning parts 7, which are combinations of the engaging part 70 and the engaged part 71, is a small margin positioning part 7a in which the clearance between the engaging part 70 and the engaged part 71 is relatively small. The other positioning parts 7 are large margin positioning parts 7b in which the clearance between the engaging part 70 and the engaged part 71 is relatively large.

As shown in FIG. 5, the negative electrode bus bar 41 is formed with four engaged parts 71. The seat 60 has engaging parts 70 which respectively engage with the four engaged parts 71 of the negative electrode bus bar 41. One of the four positioning parts 7, which are combinations of the engaging part 70 and the engaged part 71, is the small margin positioning part 7a. Other three positioning parts 7 are large margin positioning parts 7b. The width of the notch of the small margin positioning part 7a is smaller than the widths of the notches of the large margin positioning parts 7b.

As shown in FIG. 4, the positive electrode bus bar 40 is also formed with four engaged parts 71. The seat 60 is formed with engaging parts 70 which engage with the engaged parts 71 of the positive electrode bus bar 40. One of the four positioning parts 7, which are combinations of the engaging part 70 and the engaged part 71, is the small margin positioning part 7a. Other three positioning parts are the large margin positioning parts 7b. The width of the notch of the small margin positioning part 7a is smaller than the widths of the notches of the large margin positioning parts 7b.

The area of the positive electrode bus bar 40 when viewed from the Z direction is larger than that of the negative electrode bus bar 41. The positive electrode bus bar 40 extends from one space between the small margin positioning part 7a and the large margin positioning part 7b to the connecting part 602 (refer to FIG. 3) side and over the connecting part 602. In addition, the positive electrode bus bar 40 bends toward the stacked body 100 side so as to be a crank shape when viewed from the X direction. Slit parts 400 described later are formed at the end portion of the extended side of the positive electrode bus bar 40.

The positive electrode bus bar 40 having the above shape covers the connecting part 602 (refer to FIG. 3) from the side to which the power terminals 3 project.

As shown in FIG. 5, the negative electrode bus bar 41 is formed with slit parts 400 to be connected to the negative electrode power terminal 31. In addition, a capacitor connecting nut 8 for fixing a terminal of a capacitor, which is not shown, is buried in the seat 60 (refer to FIG. 3) on which one end of the negative electrode bus bar 41 is mounted, in a state where the capacitor connecting nut 8 opens from the seating face 65. In addition, the negative electrode bus bar 41 is formed with a through-hole 80 at the position corresponding to the capacitor connecting nut 8. A male screw, which is not shown, is inserted into a through-hole provided in the terminal of the capacitor and the through-hole 80 of the negative electrode bus bar 41 and is screwed into the capacitor connecting nut 8 so that the terminal of the capacitor is fastened together with the negative electrode bus bar 41, whereby the terminal of the capacitor and the negative electrode bus bar 41 are electrically connected to each other.

Similarly, a capacitor connecting nut 8 for fixing a terminal of a capacitor, which is not shown, is buried in the seat 60 (refer to FIG. 3) on which one end of the positive electrode bus bar 40 is mounted, in a state where the capacitor connecting nut 8 opens from the seating face 65. In addition, the positive electrode bus bar 40 is formed with a through-hole 81 at the position corresponding to the capacitor connecting nut 8. A male screw, which is not shown, is inserted into a through-hole provided in the terminal of the capacitor and the through-hole 81 (refer to FIG. 4) of the positive electrode bus bar 40 and is screwed into the capacitor connecting nut 8 so that the terminal of the capacitor is fastened together with the positive electrode bus bar 40, whereby the terminal of the capacitor and the positive electrode bus bar 40 are electrically connected to each other.

Figure 6:
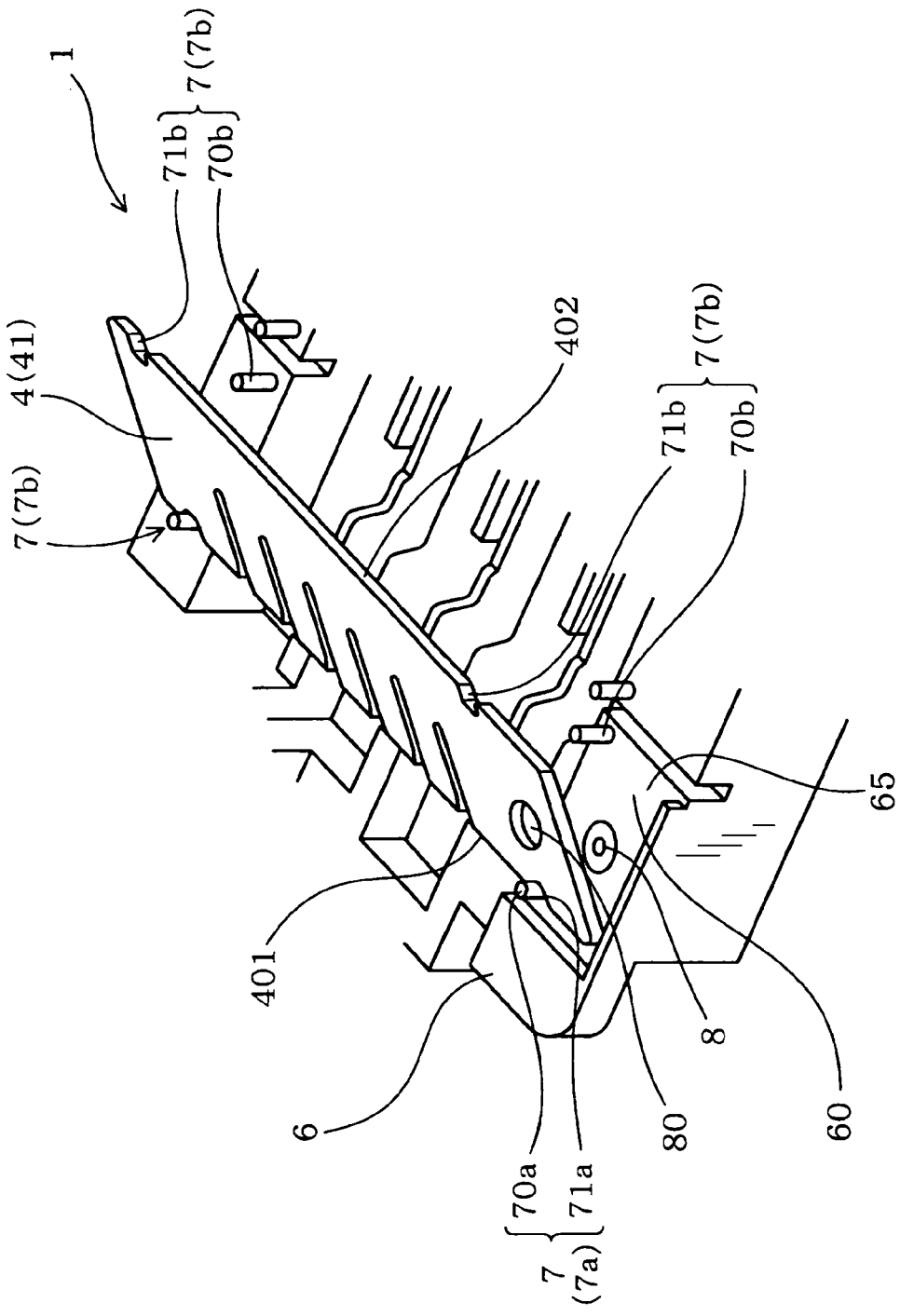
FIG. 6 is a perspective view for explaining a step of mounting the negative bus bar on the seat formed of insulating resin.

When performing a step of mounting the negative electrode bus bar 41 on the seats 60, as shown in FIG. 6, all the positioning parts 7 are not simultaneously engaged. Instead, the small margin positioning part 7a of the four positioning parts 7 is engaged first. That is, as shown in FIG. 6, the negative electrode bus bar 41 is attached to the seats 60 from the oblique direction. Then, an engaged part 71a formed in one side portion 401 of the negative electrode bus bar 41 and having a small notch width is engaged with the engaging part 70a. Simultaneously, the large margin positioning part 7b formed in one side portion 401 is engaged.

Figure 7:
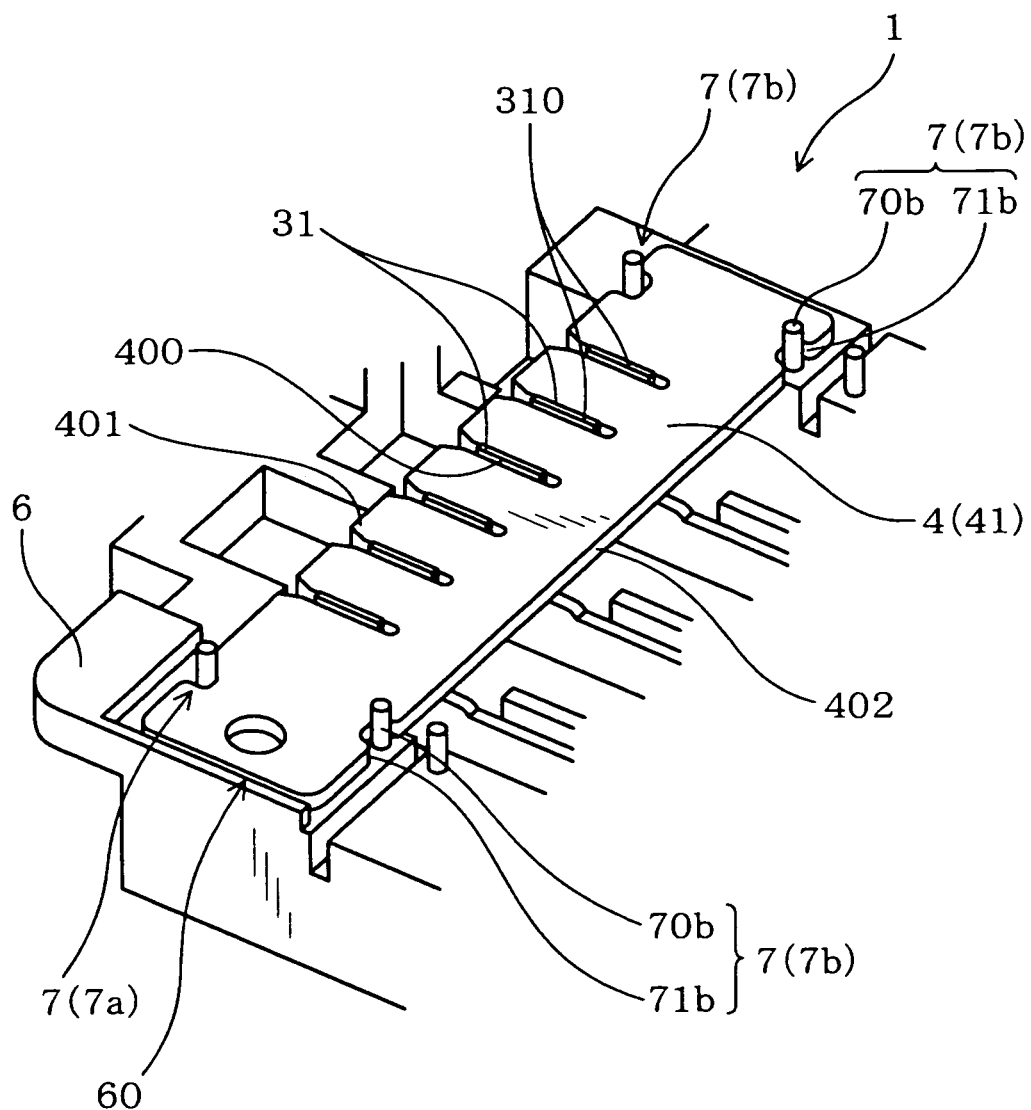
FIG. 7 is a perspective view continued from FIG. 6.

Then, as shown in FIG. 7, by turning the negative electrode bus bar 41 centering on the positioning parts 7a and 7b formed in one side portion 401, the other side portion 402 approaches the seats 60. Then, two engaged parts 71b formed in the other side portion 402 are engaged with the engaging parts 70b of the seats 60.

When mounting the negative electrode bus bar 41 on the seats 60, as shown in FIG. 1, the negative electrode power terminals 31 are inserted into the slits 400. The end faces 310 of the negative electrode power terminals 31 are positioned so as to be flush with the main surface of the negative electrode bus bar 41, and a welding process is performed, whereby the negative electrode power terminals 31 and the negative electrode bus bar 41 are connected to each other.

Figure 8:
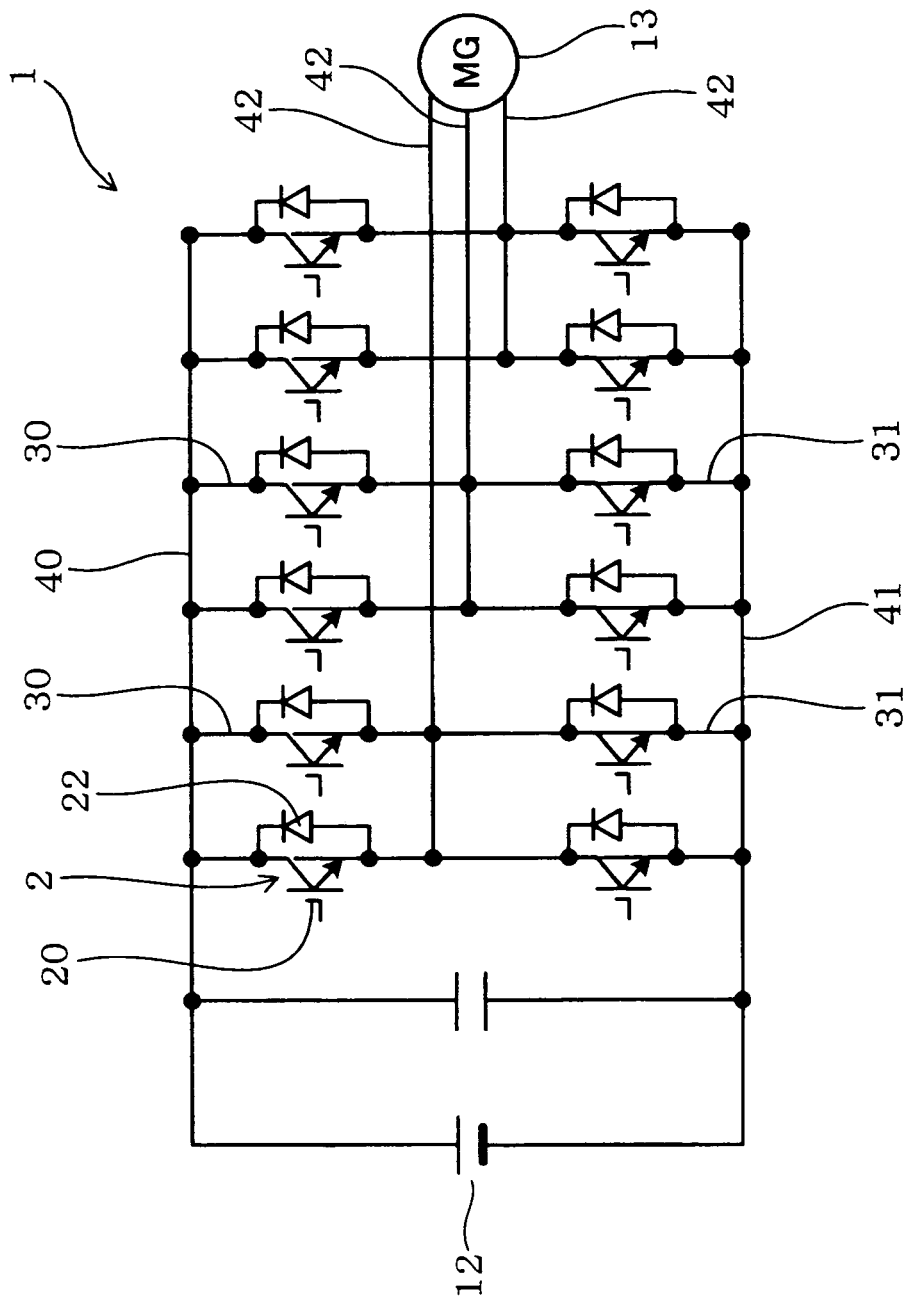
FIG. 8 is a circuit diagram of the power conversion apparatus according to the first embodiment.

Next, the circuit diagram of the power conversion apparatus 1 is shown in FIG. 8. As shown in FIG. 8, the power conversion apparatus 1 of the present embodiment is configured with a plurality of semiconductor modules 2. Each of the semiconductor modules 2 includes a switching element 20 (IGBT element) and a free wheel diode 22. In addition, the positive electrode bus bar 40 is connected to all the positive electrode power terminals 30 of the semiconductor modules 2 located at the high side. The negative electrode bus bar 41 is connected to all the negative electrode power terminals 31 of the semiconductor modules 2 located at the low side. In addition, the AC bus bars 42 are connected to a three-phase AC motor 13.

Meanwhile, the power conversion apparatus 1 is installed in a vehicle. By the switching operation of the switching elements 20, electric power of a DC power source 12 is converted into AC to drive the three-phase AC motor 13, whereby the car runs.

Figure 9:
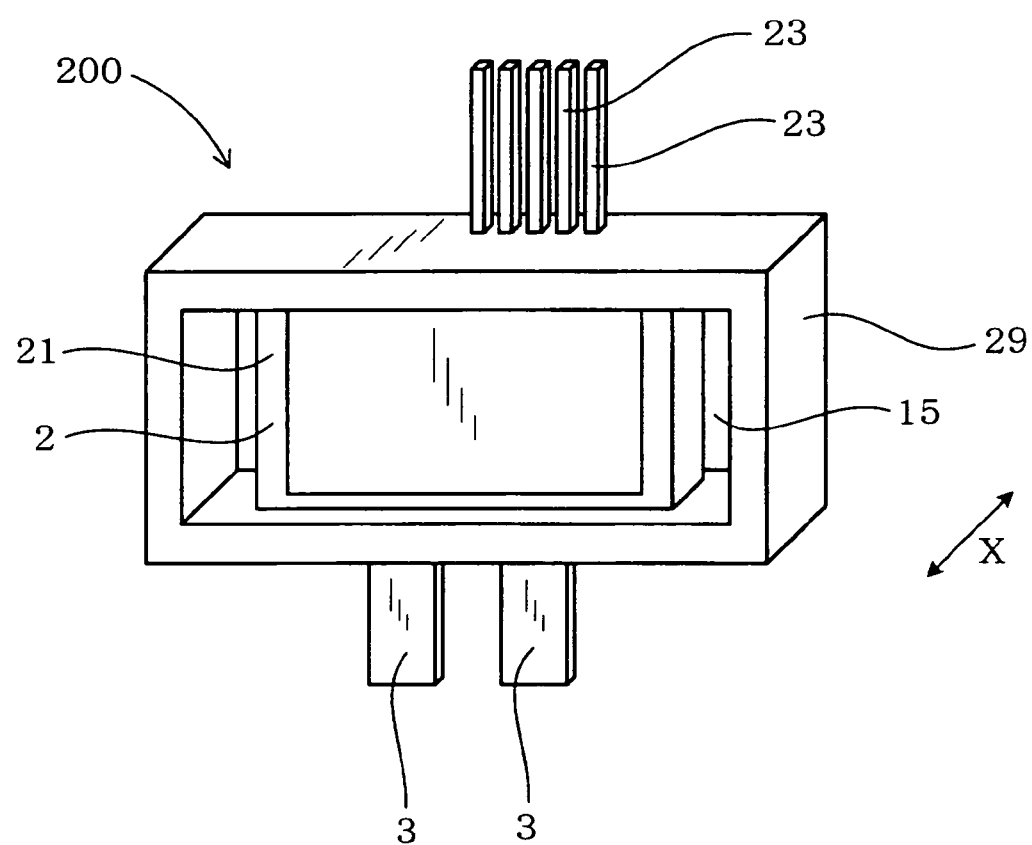
FIG. 9 is an example in which a semiconductor module and a refrigerant flow path are integrated with each other, according to the first embodiment.

Note that, in the present embodiment, the stacked body 100 is configured by stacking the plurality of cooling tubes 10 having the refrigerant flow paths 15 therein and the plurality of semiconductor modules 2 with each other. However, the refrigerant flow paths 15 are not necessarily configured by the cooling tubes 10. For example, as shown FIG. 9, a stacked structure, in which the semiconductor modules 2 and the refrigerant flow paths 15 are stacked with each other, may be configured by stacking cooler integrated type semiconductor modules 200. The cooler integrated type semiconductor module 200 has a frame part 29 integrated with the body part 21. The frame part 29 encloses the body part 21 of the semiconductor module 2, which incorporates a semiconductor element, from the direction orthogonal to the stacked direction (X direction) with spaces provided between the frame part 29 and the body part 21. The frame part 29 has a width larger than that of the body part 21 in the stacked direction (X direction).

Next, advantages of the present embodiment will be explained.

In the power conversion apparatus 1 of the present embodiment, as shown in FIGS. 3 and 4, the AC bus bar group 51 is sealed with the insulating resin 6 which forms the seats 60. The DC bus bar group 50, which is not sealed with the insulating resin 6, is mounted on the seats 60.

According to the above configuration, only the AC bus bar group 51 is required to be sealed with the insulating resin 6, and the DC bus bar group 50 is not required to be sealed with the insulating resin 6. Hence, the amount used of the insulating resin 6, the number of forming dies for resin, and steps of forming the resin can be reduced, whereby the manufacturing cost can be lowered.

That is, according to the present embodiment, the plurality of AC bus bars 42 included in the AC bus bar group 51 can be insulated from each other by the insulating resin 6. By utilizing the seats 60 formed on the surface of the insulating resin 6, the positive electrode bus bar 40 and the negative electrode bus bar 41 included in the DC bus bar group 50 can also be insulated from each other. Hence, all the bus bars 4 can be insulated from each other with a small amount of resin.

In addition, in the present embodiment, as shown in FIGS. 1 and 2, the DC bus bar group 50 is not sealed with the insulating resin 6, but the AC bus bar group 51 is sealed with the insulating resin 6.

According to the above configuration, the power conversion apparatus 1 can easily be manufactured. That is, since the positive electrode bus bar 40 or the negative electrode bus bar 41 is connected to the plurality of power terminals 3 in common, the positive electrode bus bar 40 or the negative electrode bus bar 41 often has a simple shape in which the side portion of a metal plate is provided with slits for connecting the power terminals 3. In contrast, since the AC bus bars 42 are respectively connected to the power terminals 3, the AC bus bars 42 often have a complex shape. When the AC bus bar group 51 consisting of the AC bus bars 42 having the complex shape is sealed with the insulating resin 6 to provide one component, the component is easy to handle. Hence, when manufacturing the power conversion apparatus 1, the attachment of the AC bus bar group 51 can be improved.

In addition, according to the above configuration, the number of the components required for configuring the power conversion apparatus 1 can be decreased. That is, the DC bus bar group 50 consists of the two bus bars 4 including the positive electrode bus bar 40 and the negative electrode bus bar 41, while the AC bus bar group 51 requires the three AC bus bars 42 when three-phase AC power is outputted. Hence, the number of components can be decreased when one component is provided by sealing the AC bus bar group 51 having a number of bus bars 4 by the insulating resin 6, compared with a case where the DC bus bar group 50 is sealed with the insulating resin 6.

In addition, as shown in FIGS. 4 and 5, the insulating resin 6 has the engaging parts 70 which engage with the engaged parts 71 formed in the DC bus bar group 50. Due to the engagement between the engaging parts 70 and the engaged parts 71, the AC bus bar group 51 can be positioned on the seats 60.

According to the above configuration, as shown in FIGS. 6 and 7, when the positive electrode bus bar 40 and the negative electrode bus bar 41 are mounted on the seats 60, positioning operation can be easily performed. Hence, the burden on an operator manufacturing the power conversion apparatus 1 can be reduced.

In addition, as shown in FIG. 4, the plurality of positioning parts 7 are formed in the power conversion apparatus 1. A part of the plurality of positioning parts 7 is the small margin positioning part 7a, and the other positioning parts 7 are large margin positioning parts 7b.

According to the above configuration, as shown in FIGS. 6 and 7, the step of mounting the DC bus bar group 50 on the seats 60 can easily be performed. That is, as described above, when mounting the negative electrode bus bar 41 on the seats 60, an operator does not simultaneously perform engagement of all the positioning parts 7, but performs engagement of the small margin positioning part 7a first. Hence, the negative electrode bus bar 41 can be precisely positioned with respect to the seats. In addition, since the large margin positioning parts 7b have relatively large clearance between the engaging part 70b and the engaged part 71b. Hence, when the engagement of the small margin positioning part 7a has been performed once, the engaged parts 71b formed in the other side portion 402 of the negative electrode bus bar 41 can easily be engaged with the engaging parts 70b.

In addition, as shown in FIG. 4, the positive electrode bus bar 40 also has the small margin positioning part 7a and the large margin positioning parts 7b, and has the same advantages as those of the negative electrode bus bar 41.

As described above, according to the present embodiment, a power conversion apparatus can be provided which can be manufactured at lower cost.

Second Embodiment

Figure 11:
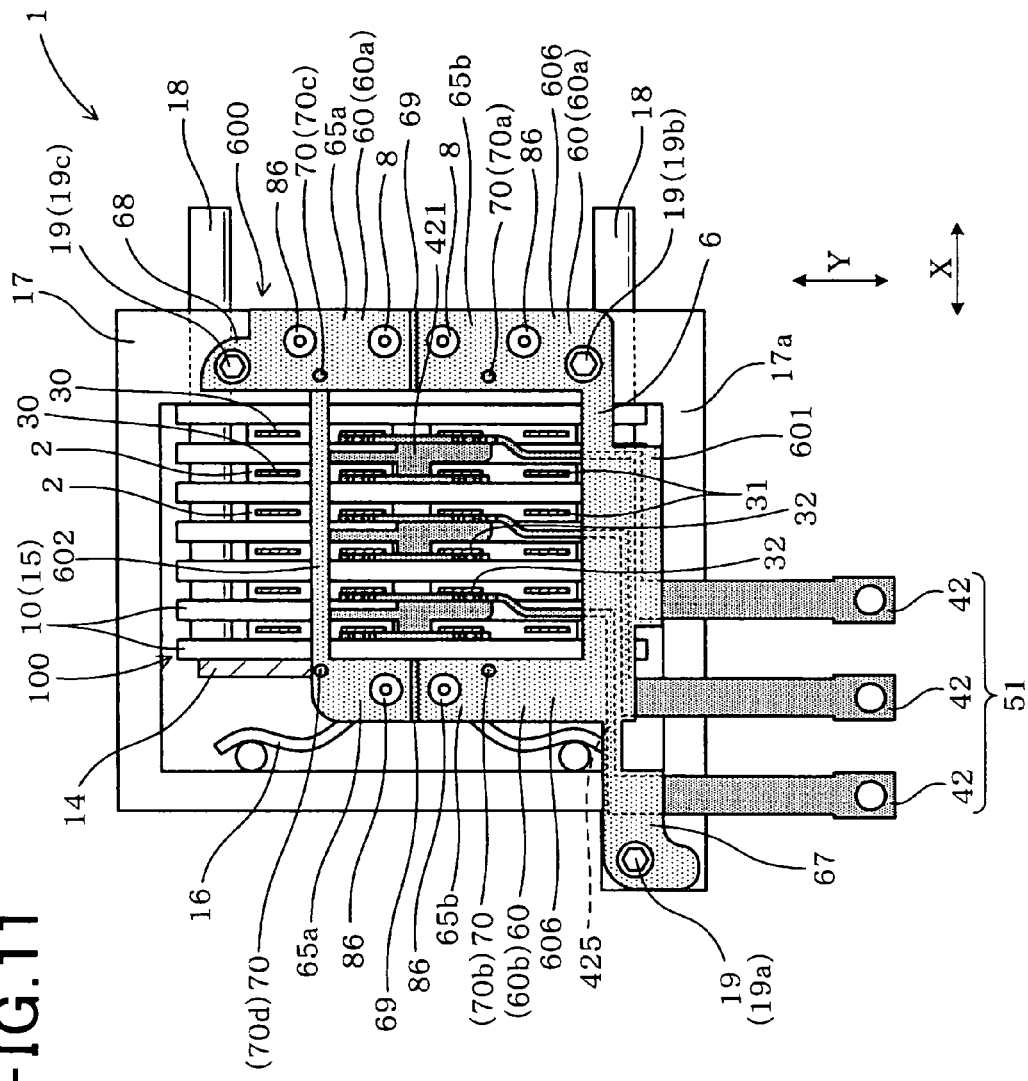
FIG. 11 is a plan view of a state in which an AC bus bar group is attached to the power conversion apparatus which is in the state shown in FIG. 10.
Figure 12:
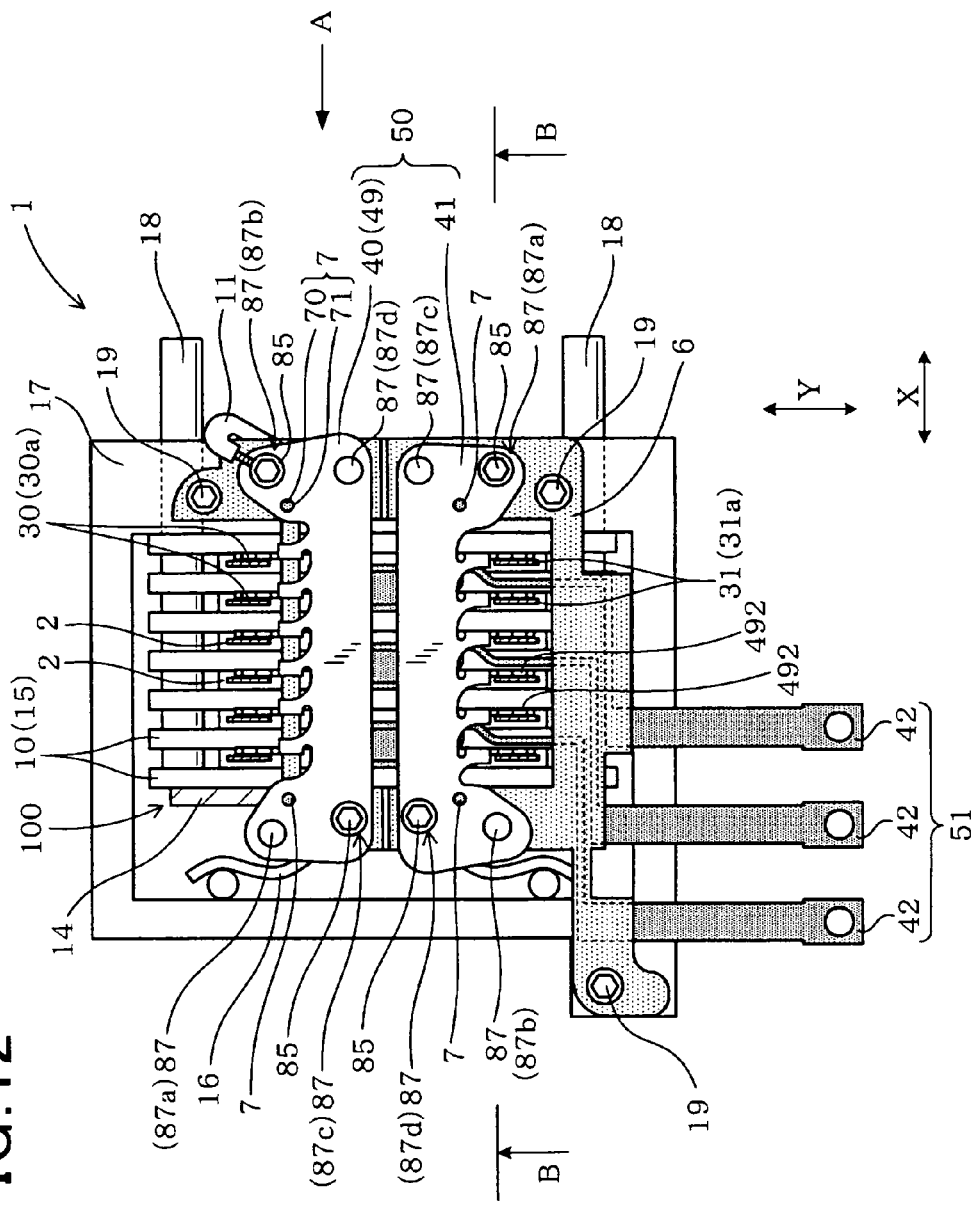
FIG. 12 is a plan view of a state in which a DC bus bar group is attached to the power conversion apparatus which is in the state shown in FIG. 11.
Figure 16:
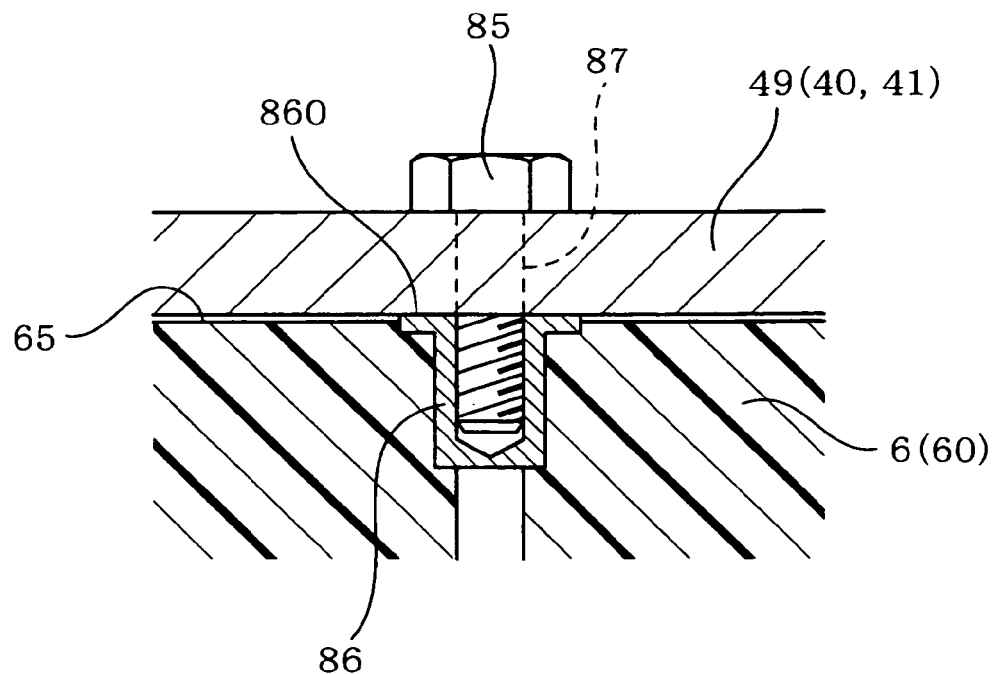
FIG. 16 is an enlarged sectional view of a fastening part for a seat and the DC bus bar, according to the second embodiment.

The present embodiment shows an example, as shown in FIGS. 11 to 14, and 16, in which the DC bus bar group 50 is fixed to the insulating resin 6 by using bolts 85 and nuts 86. As shown in FIGS. 12 and 16, in the present embodiment, the positive electrode bus bar 40 and the negative electrode bus bar 41, which configure the DC bus bar group 50 as the other bus bar group, have through-holes 87 penetrating in the thickness direction thereof. In addition, as shown in FIG. 11, a plurality of nuts 86 opened from the seats 60 are inserted into the insulating resin 6 at the positions corresponding to the through-holes 87. Furthermore, by inserting the bolts 85 into the through-holes 87 and screwing the bolts 85 into the nuts 86, the other bus bar group (DC bus bar group 50) is fixed to the insulating resin 6.

Figure 10:
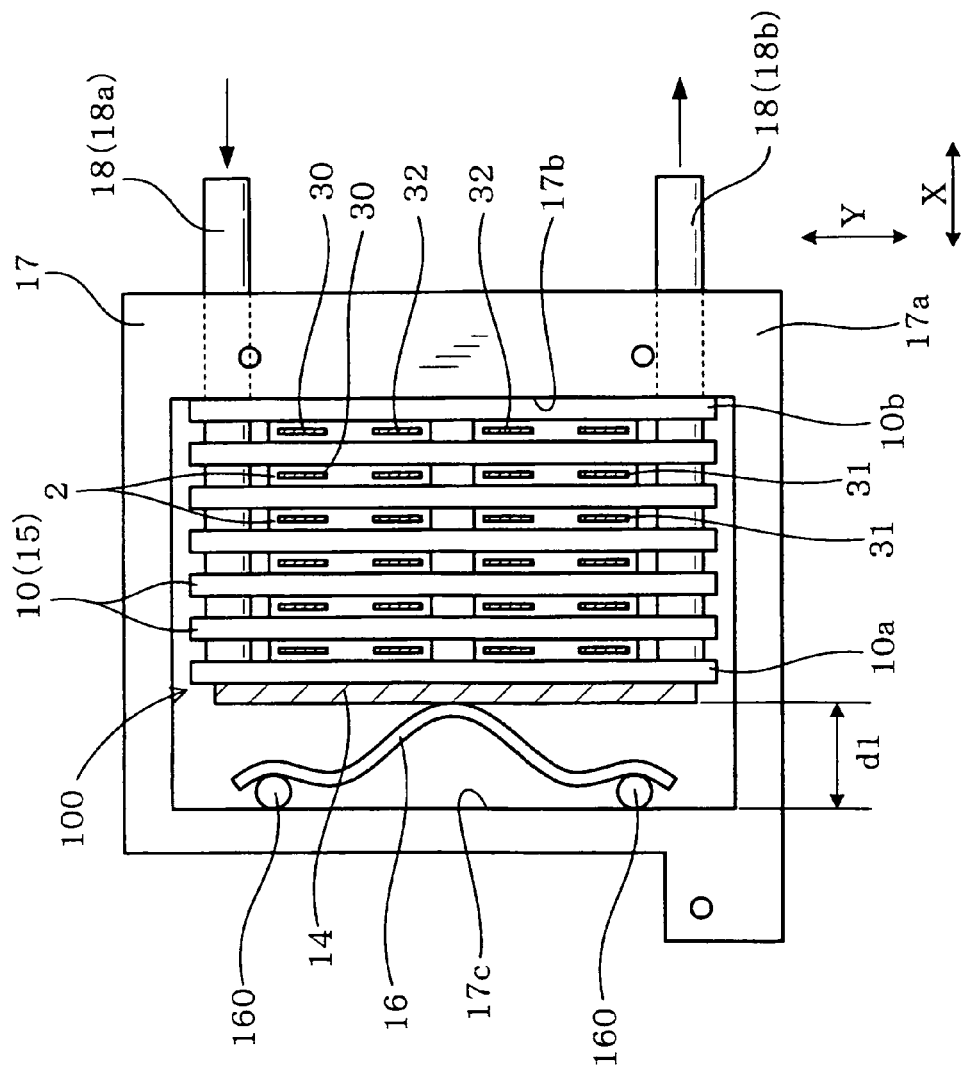
FIG. 10 is a plan view of a power conversion apparatus from which bus bars are removed, according to a second embodiment.

As shown in FIG. 10, the power conversion apparatus 1 of the present embodiment has the stacked body 100 in which the semiconductor modules 2 and refrigerant flow paths 15 (cooling tubes 10) are stacked with each other, as in the case of the first embodiment. The stacked body 100 is disposed inside the frame 17 having a substantially rectangular shape in a planar view. Inside the frame 17, a spring member 16 is provided at one end side in the stacked direction (X direction). By using the spring member 16, the stacked body 100 is pressed to an inner surface 17b of the frame 17 at the other end side in the stacked direction. Hence, the stacked body 100 is fixed inside the frame 17 while the contact pressure between the semiconductor modules 2 and the cooling tubes 10 is kept. In addition, a reinforcing plate 14 is interposed between the cooling tube 10a and the spring member 16. The reinforcing plate 14 prevents the cooling tube 10a from being dented.

Note that the above arrangement of the spring member 16 with respect to the stacked body 100 may be reversed. That is, the spring member 16 may be disposed at the side of a cooling tube 10b, to which a pair of pipes 18 are connected, so that the stacked body 100 is pressed toward an inner surface 17c of the frame 17 at the other end side in the stacked direction (X direction). In this case, the reinforcing plate 14 is disposed between the pair of pipes 18 so that the reinforcing plate 14 contacts the cooling tube 10b, and the spring member 16 is disposed between the reinforcing plate 14 and the inner surface 17b of the frame 17.

In addition, the pair of pipes 18 are attached to the cooling tube 10b located at the other end in the X direction. When a refrigerant is introduced from one pipe 18a, the refrigerant is distributed between all the cooling tubes 10 and flows therein, and is discharged from the other pipe 18b. Hence, the semiconductor modules 2 held between the cooling tubes 10 are cooled.

Figure 13:
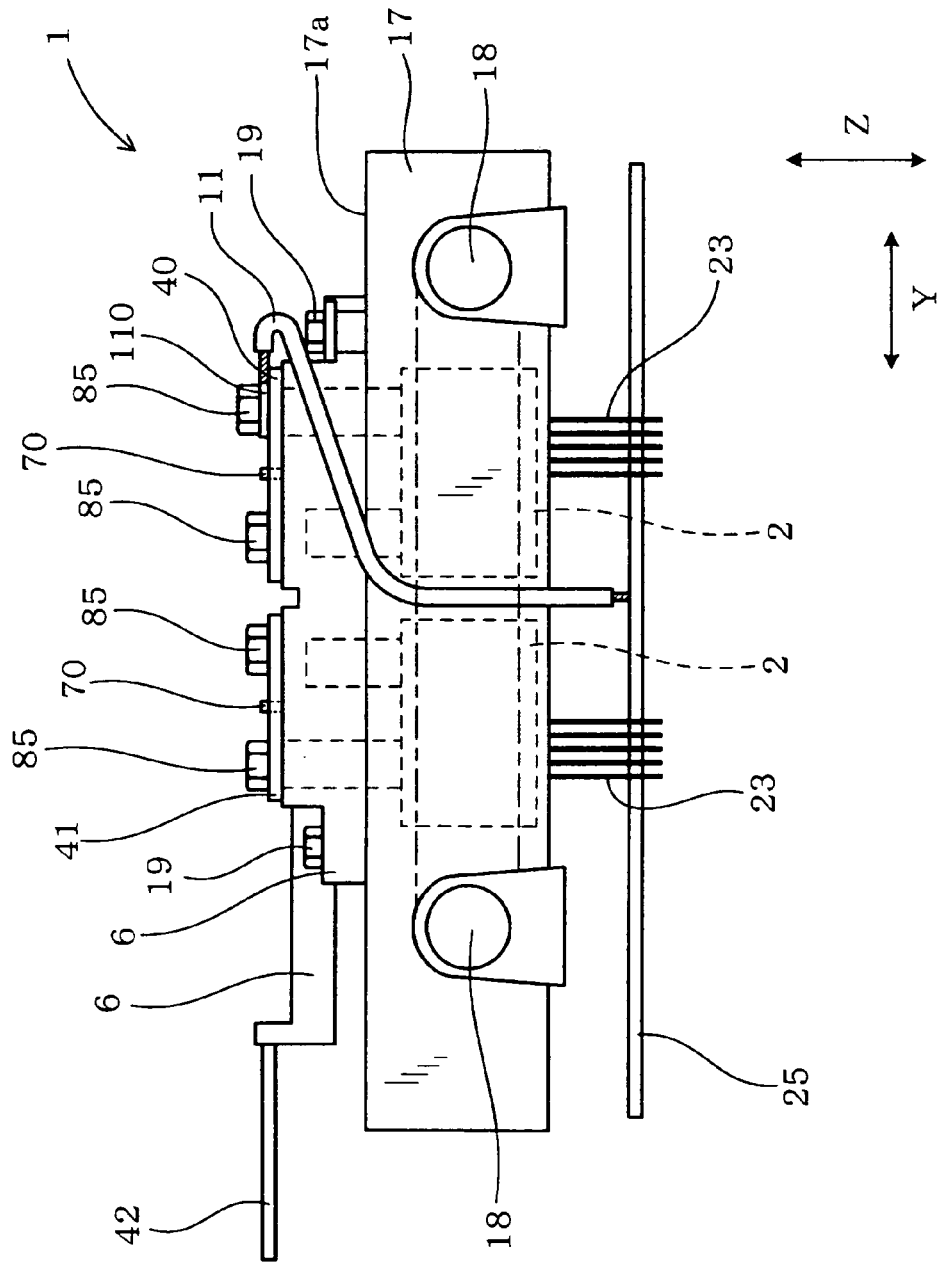
FIG. 13 is view taken in the direction of arrow A of FIG. 12.

As shown in FIGS. 11 and 13, the insulating resin 6 sealing a part of the AC bus bar group 51, which is one bus bar group, is fixed to the frame 17 inside which the stacked body 100 is arranged as described above. The insulating resin 6 is fixed to the end face 17a of the frame 7 located at the side from which the power terminals 3 of the semiconductor modules 2 project.

The insulating resin 6 has a substantially rectangular frame shape in the planar view. As in the case of the first embodiment, the insulating resin 6 configures the sealing body 600 including the sealing part 601, which seals the intermediate parts 425 of the three AC bus bars 42, the pair of seat forming parts 606, and the connecting part 602. The insulating resin 6 is fixed to the frame 17 by the three fastening members 19. That is, the fastening members 19 include a first fastening member 19a, a second fastening member 19b, and a third fastening member 19c. The first fastening member 19a fixes the insulating resin 6 to the frame 17 at a flange part 67 which is formed so as to project to one side of the sealing part 601 opposite to the pipe 18 and to the outside of the other seat 60b. The second fastening member 19b is provided in the vicinity of the intersecting point of one seat forming part 606 and the sealing part 601. In addition, the third fastening member 19c is provided at a flange part 68 which is formed so as to project to one side of one seat forming part 606 opposite to the sealing part 601 and to the outside of the connecting part 602.

The seats 60 provided on the seat forming parts 606 are formed with the seating faces 65 on which the DC bus bar group 50 is mounted. The seating faces 65 include positive electrode seating faces 65a, on which the positive electrode bus bar 40 is mounted, and negative electrode seating faces 65b, on which the negative electrode bus bar 41 is mounted. The groove parts 69 are formed between the positive electrode seating faces 65a and the negative electrode seating faces 65b.

Two nuts 86 are inserted into each of the seat 60a located at the pipe 18 side of the insulating resin 6 and the seat 60b located at the side opposite to the pipe 18 to fix the DC bus bar group 50. That is, the nuts 86 are respectively arranged in the positive electrode seating face 65a and the negative electrode seating face 65b formed on one seat 60a and the positive electrode seating face 65a and the negative electrode seating face 65b formed on the other seat 60, so as to open.

As shown in FIG. 16, an end face (nut end face 860) of each of the nuts 86 projects to the positive electrode bus bar 40 and negative electrode bus bar 41 side with respect to the seating faces 65 of the seats 60. In the present embodiment, cap nuts are used as the nuts 86.

In addition, a pair of capacitor connecting nuts 8 is inserted into the positive electrode seating face 65a and the negative electrode seating face 65b of one seat 60a at the positions opposed to each other with the groove part 69 being interposed therebetween, in a state where the capacitor connecting nuts 8 are exposed from the seating faces. The pair of capacitor connecting nuts 8 is arranged between the two nuts 86 for the DC bus bar group 50 inserted into one seat 60a.

As shown in FIG. 11, the insulating resin 6 includes four pin-shaped engaging parts 70 projecting from the seats 60 perpendicularly with respect to the seating faces 65. By engaging the engaged parts 71 (refer to FIG. 15), which are described later, formed in the DC bus bar group 50 with the engaging parts 70, the DC bus bar group 50 can be positioned.

The engaging parts 70 include a first engaging part 70a formed on the negative electrode seating face 65b of one seat 60a, a second engaging part 70b formed on the negative electrode seating face 65b of the other seat 60b, a third engaging part 70c formed on the positive electrode seating face 65a of one seat 60a, and a fourth engaging part 70d formed on the positive electrode seating face 65a of the other seat 60b. The first engaging part 70a, the second engaging part 70b, the third engaging part 70c, and the fourth engaging part 70d are respectively provided at positions corresponding to the vertexes of a rectangle whose longer side is parallel to the X direction.

Figure 15:
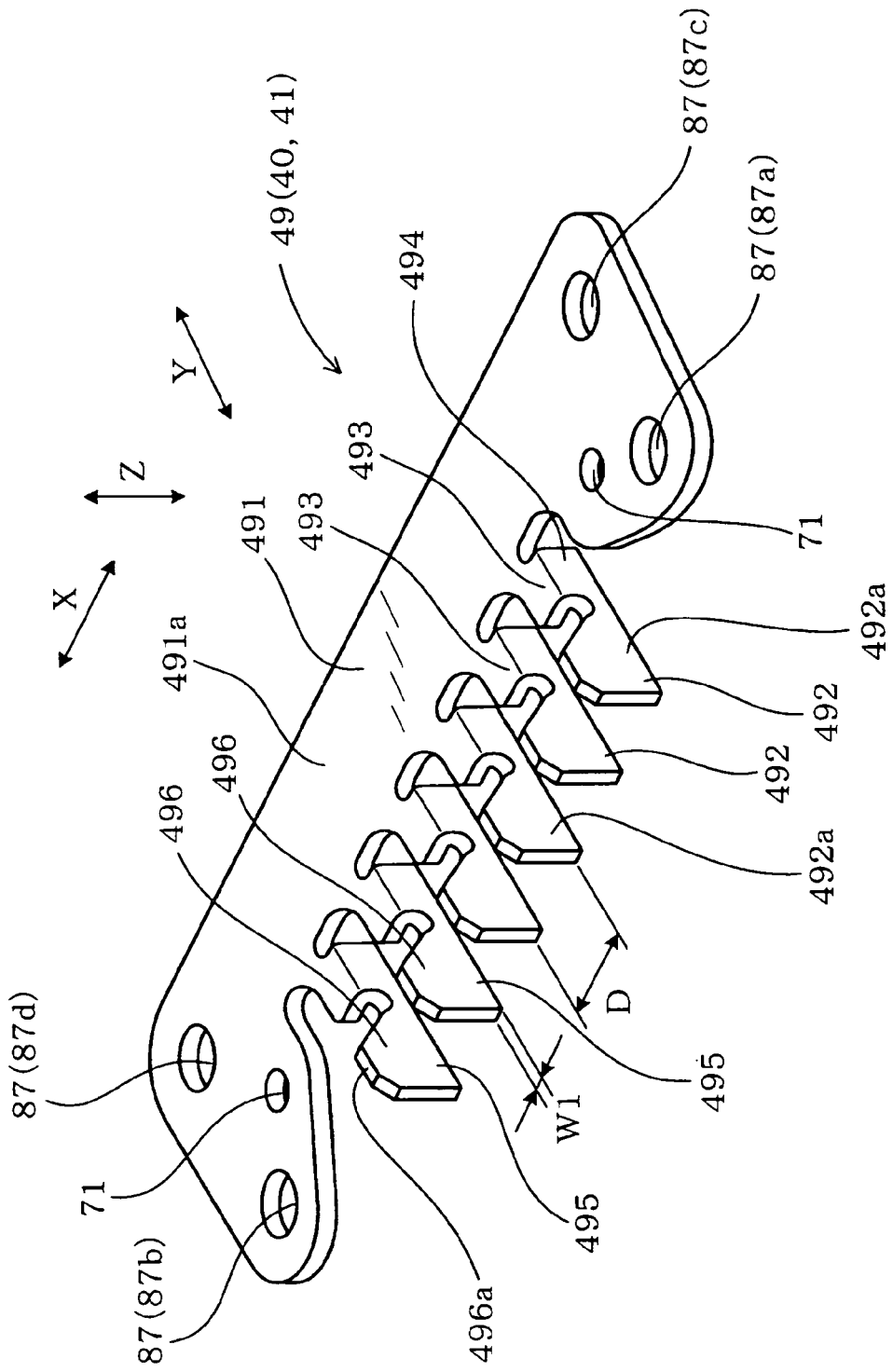
FIG. 15 is a perspective view of a DC bus bar, according to the second embodiment.

As shown in FIGS. 12 and 15, the positive electrode bus bar 40 and the negative electrode bus bar 41 have the identical shape. That is, in the present embodiment, two DC bus bars 49 having the identical shape are mounted on the seats 60 in a state where one of the DC bus bars 49 is rotated 180 degrees with respect to the other of the DC bus bars 49 around an axis extending in the Z direction. Hence, one of the DC bus bars 49 is served as the positive electrode bus bar 40, and the other of the DC bus bars 49 is served as the negative electrode bus bar 41. Note that the two DC bus bars 49 have the identical shape inclusive of positions, sizes and shapes of the through-holes 87 and the engaged parts 71 described later.

As shown in FIG. 15, the DC bus bar 49 includes a flat-plate-shaped portion 491, and a plurality of DC terminal connecting parts 492 which are perpendicular to the flat-plate-shaped portion 491 and are continued to the flat-plate-shaped portion 491. The flat-plate-shaped portion 491 is formed with the four through-holes 87, into which the bolts 85 are inserted, and the two engaged parts 71, with which the engaging parts 70 engages. All the through-holes 87 and the engaged parts 71 penetrate in the thickness direction of the flat-plate-shaped portion 491. The through-holes 87 include a first through-hole 87a, a second through-hole 87b, a third through-hole 87c and a fourth through-hole 87d. These four through-holes 87a to 87d are respectively formed at four corners of the flat-plate-shaped portion 491.

Figure 14:
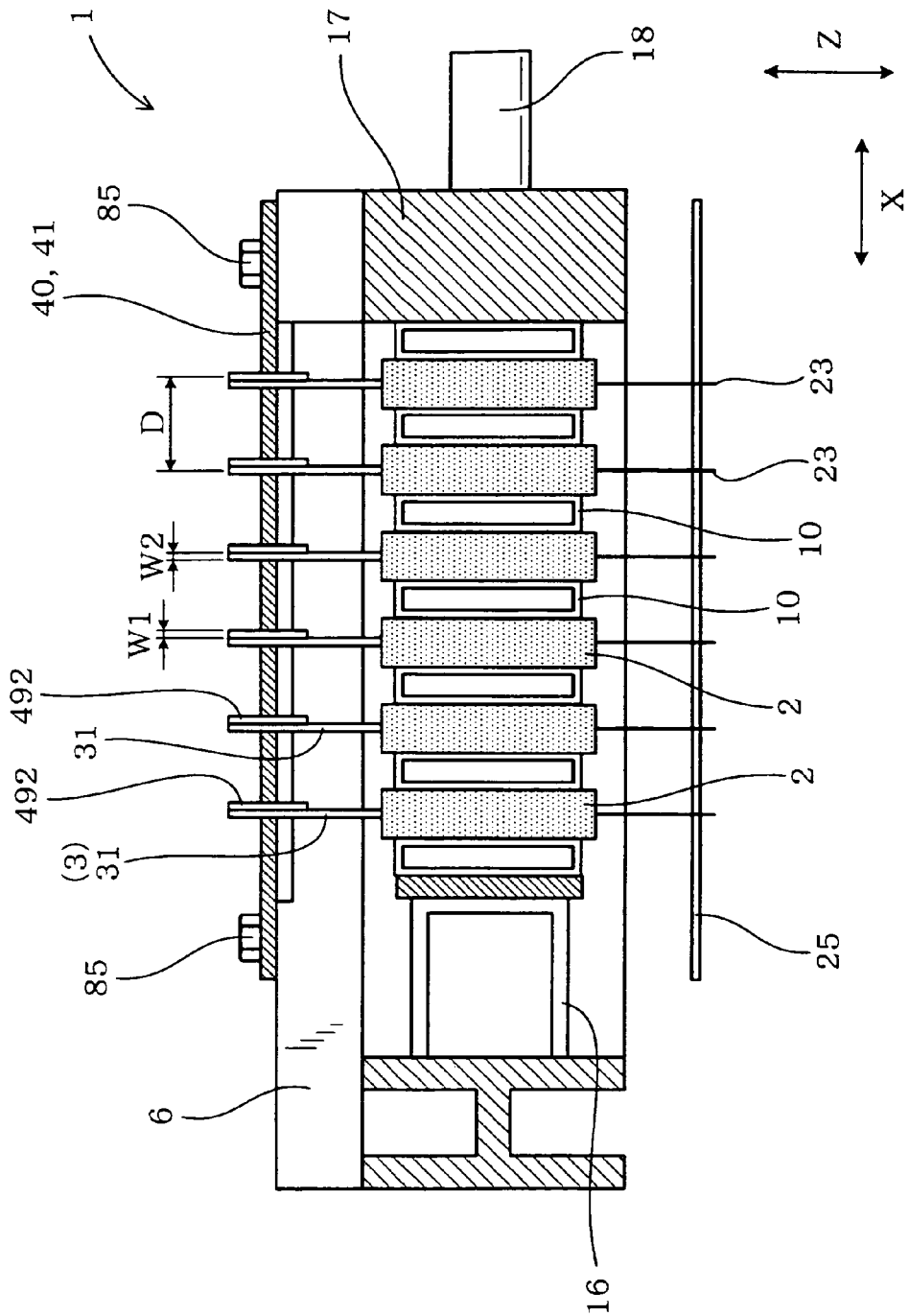
FIG. 14 is a sectional view cut along B-B of FIG. 12.

The DC terminal connecting parts 492 are formed by providing a notch, which has a predetermined shape, at the side portion of a metal plate, and bending the side portion at a right angle. A main surface 492a of the DC terminal connecting part 492 is orthogonal to a main surface 491a of the flat-plate-shaped portion 491, and is orthogonal to the X direction. In addition, the plurality of DC terminal connecting parts 492 are arranged so as to overlap with each other in the stacked direction (X direction). The distance D between the DC terminal connecting parts 492 adjacent to each other in the X direction is larger than the width W1 in the X direction of the DC terminal connecting part 492. In addition, as shown in FIG. 14, the distance D between the DC terminal connecting parts 492 adjacent to each other in the X direction is larger than the width W2 in the X direction of the power terminal 3.

Note that the main surfaces 492a and 491b indicate the surfaces whose area is the largest between a plurality of surfaces configuring the outer shape of the DC terminal connecting part 492 or the flat-plate-shaped portion 491.

Figure 17:
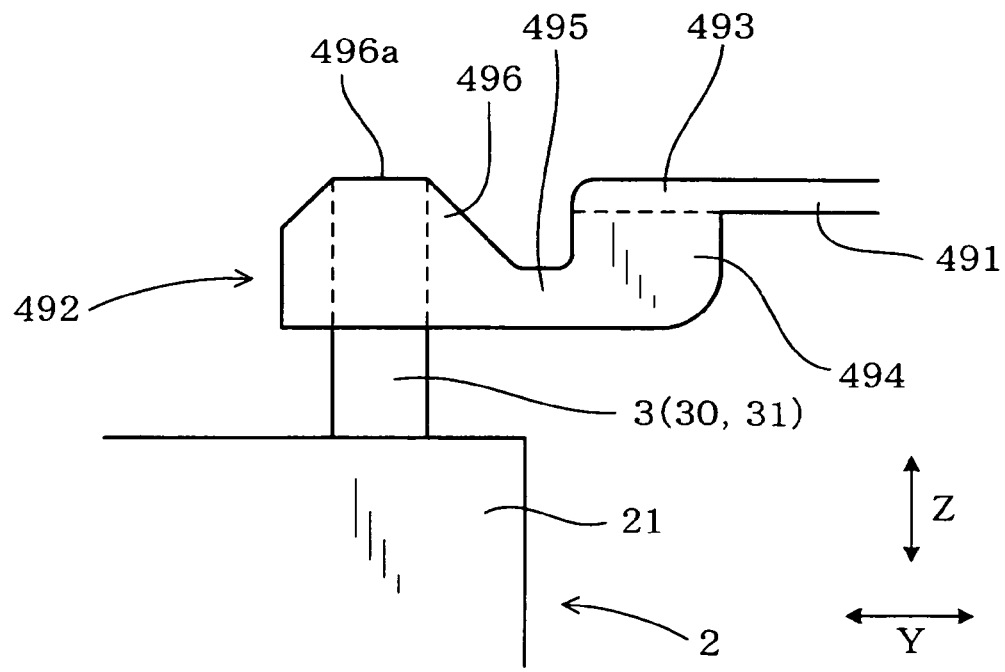
FIG. 17 is a side view of the DC bus bar and a power terminal, according to the second embodiment.

As shown in FIGS. 15 and 17, the DC terminal connecting part 492 includes a projecting portion 493, a curving portion 494, an extending portion 495, and a rising portion 496. The projecting portion 493 projects from the flat-plate-shaped portion 491 in the Y direction. The curving portion 494 is continued to the projecting portion 493. The extending portion 495 is continued to the curving portion 494 and extends in the Y direction. The rising portion 496 is provided on the extending portion 495. The width in the Y direction of the rising portion 496 becomes gradually smaller along the Z direction to an end of the power terminal 3. The top of the rising portion 496 is formed with a flat surface 496a orthogonal to the Z direction.

Two DC bus bars 49 configured as described above are prepared, one of which is used as the positive electrode bus bar 40, and the other of which is used as the negative electrode bus bar 41. In addition, both of the positive electrode bus bar 40 and the negative electrode bus bar 41 are mounted on the seats 60 of the insulating resin 6 so that the DC terminal connecting parts 492 of the positive electrode bus bar 40 and those of the negative electrode bus bar 41 extend in the Y direction and in the directions opposite to each other.

As shown FIG. 12, in the present embodiment, the bolts 85 are respectively inserted into the second through-hole 87b and the third through-hole 87c of the positive electrode bus bar 40. The bolts 85 are screwed into the nuts 86 (refer to FIG. 11) which are inserted into the seats 60 at positions respectively corresponding to the positions at which the through-holes 87 are formed. Hence, the positive electrode bus bar 40 is fixed to the insulating resin 6. In this state, as shown in FIG. 12, the fourth through-hole 87d of the positive electrode bus bar 40 opens above the capacitor connecting nut 8 formed in the positive electrode seating faces 65a.

In addition, the bolts 85 are respectively inserted into the first through-hole 87a and the fourth through-hole 87d of the negative electrode bus bar 41. The bolts 85 are screwed into the nuts 86 (refer to FIG. 11) which are inserted into the seats 60 at positions respectively corresponding to the positions at which the through-holes 87 are formed. Hence, the negative electrode bus bar 41 is fixed to the insulating resin 6. In this state, as shown in FIG. 12, the third through-hole 87c of the negative electrode bus bar 41 opens above the capacitor connecting nut 8 formed in the negative electrode seating faces 65b.

The two engaged parts 71 of the positive electrode bus bar 40 are respectively engaged with the third engaging part 70c (refer to FIG. 11) and the fourth engaging part 70d provided on the insulating resin 6. In addition, the two engaged parts 71 of the negative electrode bus bar 41 are respectively engaged with the first engaging part 70a (refer to FIG. 11) and the second engaging part 70b provided on the insulating resin 6. The engaged parts 71 are formed so as to have circular hole shapes. The engaging parts 70 having cylinder shapes are fitted into the engaged parts 71.

As shown in FIGS. 12 and 13, the power conversion apparatus 1 of the present embodiment includes a voltage detecting wire 11 for measuring voltage of the positive electrode bus bar 40. One end of the voltage detecting wire 11 is fastened together with the positive electrode bus bar 40 by the bolt 85 inserted into the second through-hole 87b of the positive electrode bus bar 40. In addition, the other end of the voltage detecting wire 11 is connected to the control circuit substrate 25. The other end of the voltage detecting wire 11 is electrically connected to a voltage detecting part on the control circuit substrate 25. The voltage detecting part detects the voltage of the positive electrode bus bar 40. The detected value is used for controlling the semiconductor modules 2.

Next, a method of manufacturing the power conversion apparatus 1 of the present embodiment will be explained. First, as shown in FIG. 10, the stacked body 100 is disposed inside the frame 17. Next, the spring member 16, together with the reinforcing plate 14, is disposed between the cooling tube 10a, which is one end in the stacked direction of the stacked body 100, and the inner surface 17c of the frame 17. Then, the stacked body 100 is pressed to the inner surface 17b by the spring member 16 while the spring member 16 Is compressed so as to be elastically deformed. Thereafter, pins 160 having cylinder shapes are inserted and disposed between the both end portions of the spring member 16 and the inner surface 17c of the frame 17. Next, compression force acting on the spring member 16 is released. In this case, the both end portions of the spring member 16 are supported by the pair of pins 160, and the pins 160 are supported by the inner surface 17c of the frame 17.

According to the above configuration, the spring member 16 is disposed between the inner face 17c of the frame 17 and the stacked body 100 with the pins 160 and the reinforcing plate 14 being interposed therebetween, in a state where a predetermined amount of restoring force is affected. As a result of this, a state is maintained where the spring member 16 presses the stacked body 100 to the inner face 17b of the frame 17. Hence, the stacked body 100 is fixed inside the frame 17 in a state where high contact pressure between the semiconductor modules 2 and the cooling tubes 10 is kept.

Next, as shown in FIG. 11, the insulating resin 6, which seals the AC bus bar group 51, is mounted on the end face 17a of the frame 17 at the side where the power terminals 3 projects. The insulating resin 6 is fixed to the frame 17 by using the fastening members 19a to 19c. In this case, the terminal connecting parts 421 of the AC bus bars 42 and the AC power terminal 32 are overlapped with each other via the main surfaces thereof. In addition, the terminal connecting parts 421 of the AC bus bars 42 and the AC power terminals 32 are welded to each other.

Thereafter, as shown in FIG. 12, the positive electrode bus bar 40 is moved closer to the seats 60 so that the DC terminal connecting parts 492 are inserted between the positive electrode power terminals 30 adjacent to each other in the X direction, whereby the positive electrode bus bar 40 is mounted on the seat 6. Thereafter, the positive electrode bus bar 40 is moved on the seat 6 so that the engaged parts 71 formed in the positive electrode bus bar 40 are engaged with the engaging parts 70. Hence, the positive electrode bus bar 40 is positioned.

In this case, the positive electrode bus bar 40 does not directly contact the seating faces 65 of the seats 60 of the seat 6, but is brought into contact with the nut end faces 860 (refer to FIG. 16) of the nuts 86 projecting from the seating faces 65.

Next, the bolts 85 are respectively inserted into the second through-hole 87b and the third through-hole 87c of the positive electrode bus bar 40, and are screwed into the nuts 86. Thereby, the positive electrode bus bar 40 is held between the bolt 85 and the nut 86 around each of the through-holes 87, whereby the positive electrode bus bar 40 is fastened. In this state, the positive electrode bus bar 40 is fixed to the seat 6. In this case, by using the bolt 85 inserted into the second through-hole 87b, one end of the voltage detecting wire 11 is fastened together with the positive electrode bus bar 40.

In a state where the positive electrode bus bar 40 is fixed, that is, positioned, the main faces of the positive electrode power terminals 30 and the main faces of DC terminal connecting parts 492 are in close contact with each other, and end faces 30a of the positive electrode power terminals 30 are flush with the flat surfaces 496a (refer to FIG. 17) of the DC terminal connecting parts 492. In this state, by performing a welding process for the end faces 30a and the flat surfaces 496a, the positive electrode power terminals 30 and the DC terminal connecting parts 492 are connected to each other.

Similarly, the negative electrode bus bar 41 is also mounted on the seats 60, and is fixed to the seat 6 by using the bolts 85 and nuts 86, while the DC terminal connecting parts 492 of the negative electrode bus bar are welded to the negative electrode power terminals 31.

Next, terminals of a capacitor (not shown) are placed above the fourth through-hole 87d of the positive electrode bus bar 40 and the third through-hole 87c of the negative electrode bus bar 41. Then, capacitor connecting bolts (not shown) are inserted into the through-holes 87c and 87d, and are screwed into the capacitor connecting nuts 8. Thereby, the positive electrode bus bar 40 and the negative electrode bus bar 41 are electrically connected to the capacitor.

Other configurations are the same as those of the first embodiment.

Next, advantages of the present embodiment will be explained.

In the present embodiment, as shown in FIG. 12, the bolts 85 are inserted into the through-holes 87 formed in the other bus bar group (DC bus bar group 50), and are screwed into the nuts 86 inserted into the insulating resin 6. Thereby, the DC bus bar group 50 is fixed to the insulating resin 6.

According to the above configuration, the DC bus bars 49 can be tightly fixed to the insulating resin 6 by using the bolts 85 and the nuts 86. Hence, even when the power conversion apparatus 1 is used in the environment where vibration is easily generated, for example, when the power conversion apparatus 1 is installed in a vehicle or the like, stress due to the vibration is not easily applied to connecting parts between the DC bus bars 49 and the power terminals 3. For example, in the configuration in which the power terminals 3 and the DC bus bars 49 are welded to each other, stress is prevented from being applied to the welding portion due to the vibration, thereby preventing cracks and the like from being generated in the welding portion. Therefore, the reliability of the power conversion apparatus 1 can be improved.

In addition, in the present embodiment, the positive electrode bus bar 40 and the negative electrode bus bar 41 are respectively fixed to the insulating resin 6 at a plurality of positions by using the bolts 85 and the nuts 86. Hence, vibration resistance of the positive electrode bus bar 40 and the negative electrode bus bar 41 can be improved. Hence, stress due to the vibration is not more easily applied to the connecting parts between the DC bus bars 49 and the power terminals 3, thereby further improving the reliability of the power conversion apparatus 1.

In addition, as shown in FIG. 16, the nut 86 has a nut end face 860 projecting with respect to the seating face 65 of the seat 60 of the insulating resin 6. The nut end face 860 is brought into contact with the other DC bus bar group 50.

Figure 20:
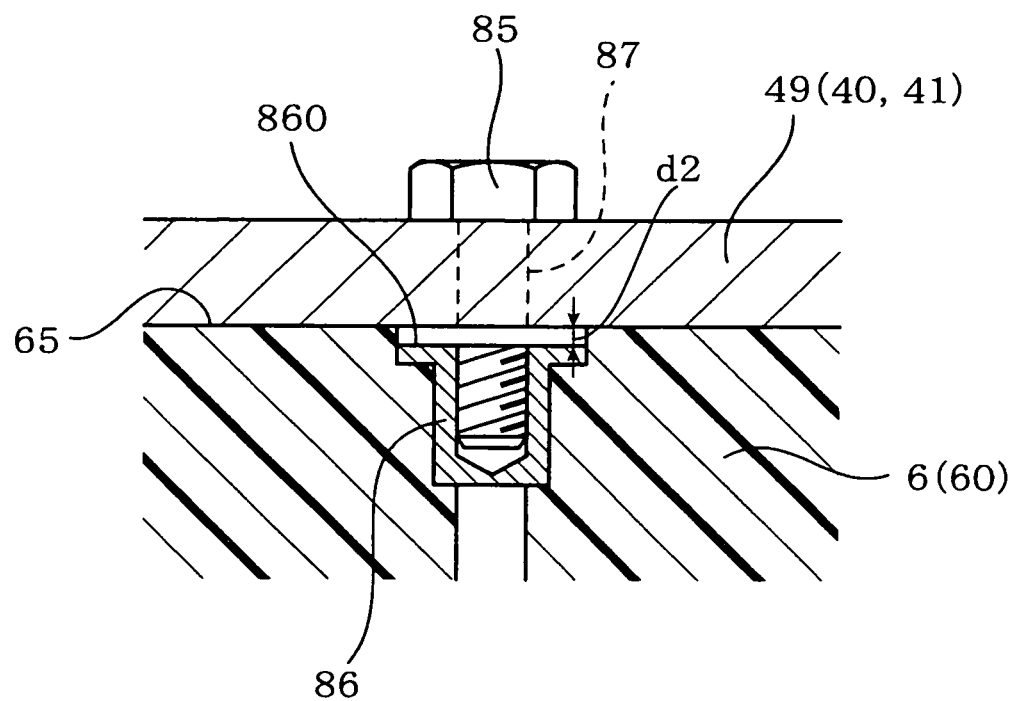
FIG. 20 is an enlarged sectional view of a fastening part for a seat, from a seating face of which an end face of a nut does not project, and a DC bus bar.

According to the above configuration, since the DC bus bars 49 can be fastened and fixed to the seats 60 in a state where the DC bus bars 49 are held by the bolts 85 and the nuts 86, the bolts 85 are not easily loosened. That is, as shown in FIG. 20 as an example, if the nut end face 860 does not project from the seating face 65 of the seat 60 of the insulating resin 6, the DC bus bar 49 is brought into close contact with the seating face 65, thereby generating a gap d2 between the DC bus bar 49 and the nut end face 860. Hence, the bolt 85 is easily loosened when, for example, vibration is generated. However, as shown in FIG. 16, the nut end face 860 projects from the seating face 65 of the seat 60, thereby eliminating the gap between the DC bus bar 49 and the nut end face 860. Hence, the DC bus bar 49 can be fixed in a state where the DC bus bar 49 is held between the bolts 85 and the nuts 86. Therefore, the bolts 85 can be tightly fastened, whereby the bolts 85 are not easily loosened.

In addition, in the present embodiment, as shown in FIGS. 12 and 13, one end of the voltage detecting wire 11 is fastened together with the positive electrode bus bar 40 by the bolt 85 fixing the positive electrode bus bar 40 to the insulating resin 6.

According to the above configuration, the bolt and the nut for fixing the voltage detecting wire 11 can double as the bolt 85 and the nut 86 for fixing the positive electrode bus bar 40 to the insulating resin 6. Hence, the bolt and the nut for fixing the voltage detecting wire 11 are not required to be additionally provided, whereby the number of the bolts and the nuts to be used can be decreased. Therefore, the manufacturing cost of the power conversion apparatus 1 can be lowered.

In addition, in the present embodiment, as shown in FIG. 12, the positive electrode bus bar 40 and the negative electrode bus bar 41 have the identical shape.

According to the above configuration, since the DC bus bars 49 having the identical shape can be used as both the positive electrode bus bar 40 and the negative electrode bus bar 41, types of components to be used can be decreased. Hence, the manufacturing cost can be lowered, and the attachment process can be facilitated.

In addition, in the present embodiment, as shown in FIG. 15, the distance D between the DC terminal connecting parts 492 adjacent to each other in the X direction is larger than the width W1 in the X direction of the DC terminal connecting part 492. Furthermore, as shown in FIG. 12, each of the positive electrode bus bar 40 and the negative electrode bus bar 41 includes two engaged parts 71. The engaged parts 71 are formed so as to have circular hole shapes into which the engaging parts 70 are fitted.

In this case, the step of connecting the positive electrode bus bar 40 and the negative electrode bus bar 41 to the power terminals 3 can easily be performed. That is, as described above, when the distance D between the DC terminal connecting parts 492 adjacent to each other in the X direction is large, the DC terminal connecting part 492 can be easily inserted between the power terminals 3 adjacent to each other in the X direction, and the DC bus bar 49 can be mounted on the seats 60, without precisely positioning the DC bus bar 49. Then, after being mounted on the seats 60, the DC bus bar 49 is moved on the seats 6 so that the engaging parts 70 are engaged with the engaged parts 71, whereby positioning operation can be performed. Therefore, the positive electrode bus bar 40 and the negative electrode bus bar 41 can be easily attached to the insulating resin.

As described above, since the DC bus bars 49 can be positioned after the DC bus bars 49 are mounted on the seats 60, the operation for fitting the engaging parts 70 into the engaged parts 71 is not difficult even when the engaged parts 71 have hole shapes. Hence, the engaged parts 71 have hole shapes can be used, which enables to provide two engaged parts 71 for each of the DC bus bars 49. Therefore, the positioning operation can be easily performed.

The other same advantages as those of the first embodiment are provided.

Third Embodiment

Figure 18:
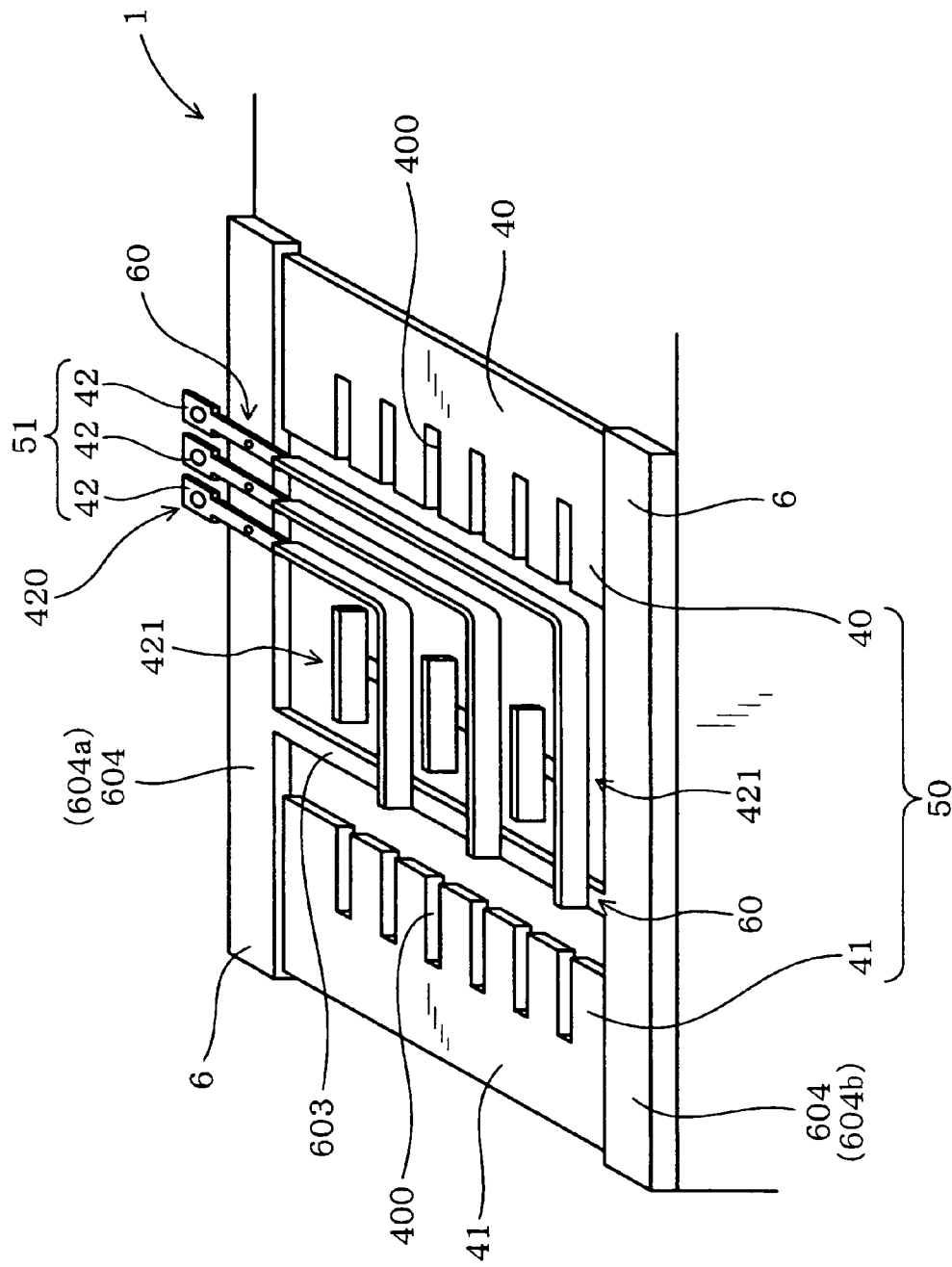
FIG. 18 is an enlarged perspective view of a main part of a power conversion apparatus from which semiconductor modules are omitted, according to a third embodiment.
Figure 19:
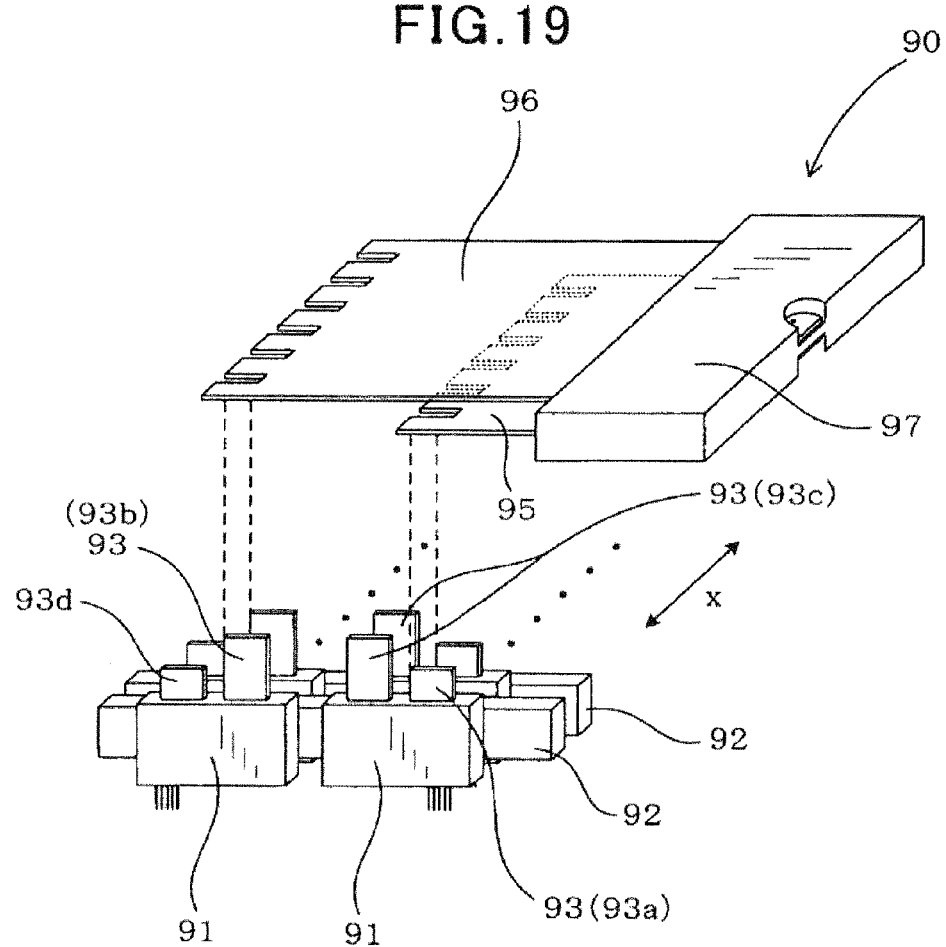
FIG. 19 is a perspective view of a power conversion apparatus according to a conventional example.

The present embodiment is an example in which the configurations of the bus bars 4 are modified. As shown in FIG. 18, in the present embodiment, a part of the DC bus bar group 50 consisting of the positive electrode bus bar 40 and the negative electrode bus bar 41 is sealed with the insulating resin 6. The seats 60 are formed using the insulating resin 6. Then, the AC bus bar group 51, which is not sealed with the insulating resin 6, is mounted on and fixed to the seats 60.

As shown in FIG. 18, the slits 400 are formed in the side portions of the positive electrode bus bar 40 and the negative electrode bus bar 41. Positive electrode power terminals and negative power terminals, which are not shown, are inserted into the slits 400 and are welded. The positive electrode bus bar 40 and the negative electrode bus bar 41 are molded to the insulating resin 6 in a state where the slits 400 of the positive electrode bus bar 40 and the slits 400 of the negative electrode bus bar 41 are opposed to each other. In addition, terminal connecting parts 421 of the AC bus bars 42 are arranged between the positive electrode power terminals 30 and the negative electrode power terminals 31.

Meanwhile, the insulating resin 6 consists of side portion sealing parts 604 and a connecting part 603. The side portion sealing parts 604 seal one end portion of the positive electrode bus bar 40 and one end portion of the negative electrode bus bar 41 and the other end portion of the positive electrode bus bar 40 and the other end portion of the negative electrode bus bar 41, and connect the positive electrode bus bar 40 and the negative electrode bus bar 41 to integrate the bus bar 40 and the bus bar 41 with each other. In addition, the connecting part 603 connects one side portion sealing part 604a and the other side portion sealing part 604b. The seats 60 are formed on the side portion sealing parts 604 and the connecting part 603.

The AC bus bar 42 includes the external connecting part 420 to be connected to an external device and the terminal connecting part 421 to be connected to the AC power terminal 32, which is not shown. One ends of the terminal connecting parts 421 are mounted on the connecting part 603 described above. In addition, the external connecting parts 420 are mounted on the seat 60 formed on the side portion sealing part 604.

The other same advantages are provided as those of the first embodiment.

Next, advantages of the present embodiment will be explained.

In the present embodiment, only part of the DC bus bar group 50 is required to be sealed with the insulating resin 6, and the AC bus bar group 51 is not required to be sealed with the insulating resin 6. Hence, the amount used of the insulating resin 6 can be reduced. In addition, the AC bus bar group 51 can be mounted on the seats 60 made of the insulating resin 6. Hence, variations of positional relationships of the bus bar groups 5 are increased, whereby the degree of freedom of design can be improved.

The other same advantages are provided as those of the first embodiment.

Hereinafter, aspects of the above-described embodiments will be summarized.

As an aspect of the embodiment, power conversion apparatus includes: a plurality of semiconductor modules which have a body part incorporating a switching element configuring a power conversion circuit, and in which power terminals, which conduct electricity to the switching element, project from the body part; and a plurality of bus bars to which the power terminals are connected. The plurality of power terminals include a positive electrode power terminal, a negative electrode power terminal, and an AC power terminal, the positive electrode power terminal being electrically connected to a positive electrode of a DC power source, the negative electrode power terminal being electrically connected to a negative electrode of the DC power source, and the AC power terminal being electrically connected to an AC load. The plurality of bus bars include a positive electrode bus bar, a negative electrode bus bar, and a plurality of AC bus bars, the positive electrode bus bar being connected to the positive electrode power terminal, the negative electrode bus bar being connected to the negative electrode power terminal, and the plurality of AC bus bars being connected to the AC power terminal. A DC bus bar group includes the positive electrode bus bar and the negative electrode bus bar, an AC bus bar group includes the plurality of AC bus bars, a part of one of the bus bar groups is sealed with an insulating resin, and the other of the bus bar groups is not sealed with the insulating resin. A seat is formed on the insulating resin sealing the one of the bus bar groups, and the other of the bus bar groups is mounted on a seat face of the seat.

In the above power conversion apparatus, one of the DC bus bar group and the AC bus bar group is sealed with the insulating resin. The seat is formed using the insulating resin. The other of the bus bar groups, which is not sealed with the insulating resin, is mounted on the seat.

According to the above configuration, only one bus bar group of the DC bus bar group and the AC bus bar group is required to be sealed with the insulating resin, and the other bus bar group is not required to be sealed with the insulating resin. Hence, the amount used of the insulating resin, the number of forming dies for resin, and steps of forming the resin can be reduced, whereby the manufacturing cost can be lowered.

That is, the plurality of bus bars included in one bus bar group can be insulated from each other by the insulating resin and can be fixed. By utilizing the seats formed on the surface of the insulating resin, the plurality of bus bars included in the other bus bar group can also be insulated from each other. Hence, all the bus bars can be insulated from each other with a small amount of resin.

As described above, a power conversion apparatus can be provided which can be manufactured at low cost.

In the above power conversion apparatus, preferably, the one of the bus bar groups is the AC bus bar group, and the other of the bus bar groups is the DC bus bar group.

According to the above configuration, the power conversion apparatus can easily be manufactured. That is, since the positive electrode bus bar or the negative electrode bus bar is connected to the plurality of power terminals in common, the positive electrode bus bar or the negative electrode bus bar often has a simple shape in which the side portion of a metal plate is provided with slits for connecting the power terminals. In contrast, since the AC bus bars are respectively connected to the power terminals, the AC bus bars often have a complex shape. When the AC bus bar group consisting of the AC bus bars having the complex shape is sealed with the insulating resin to provide one component, the component is easy to handle. Hence, when manufacturing the power conversion apparatus, the attachment of the AC bus bar group can be improved.

In addition, according to the above configuration, the number of the components required for configuring the power conversion apparatus can be decreased. That is, the DC bus bar group consists of the two bus bars including the positive electrode bus bar and the negative electrode bus bar, while the AC bus bar group required the three AC bus bars when three-phase AC power is outputted. Hence, the number of components can be decreased when one component is provided by sealing the AC bus bar group having a number of bus bars, compared with a case where the DC bus bar group is sealed with the insulating resin.

In addition, preferably, the positive electrode bus bar and the negative electrode bus bar configuring the other of the bus bar groups have through-holes penetrating in the thickness direction thereof, a plurality of nuts opened from the seat face of the seat are inserted into the insulating resin at positions corresponding to the through-holes, and the other of the bus bar groups is fixed to the insulating resin by inserting bolts into the through-holes and screwing the bolts into the nuts.

In this case, the other bus bar group can be tightly fixed to the insulating resin by using the bolts and the nuts. Hence, even when the power conversion apparatus is used in the environment where vibration is easily generated, for example, when the power conversion apparatus is installed in a vehicle or the like, stress due to the vibration is not easily applied to connecting parts between the other bus bar group (DC bus bars) and the power terminals. For example, in the configuration in which the power terminals and the DC bus bars are welded to each other, stress is prevented from being applied to the welding portion due to the vibration, thereby preventing cracks from being generated in the welding portion. Therefore, the reliability of the power conversion apparatus can be improved.

In addition, preferably, each of the positive electrode bus bar and the negative electrode bus bar is formed with a plurality of the through-hole.

In this case, the positive electrode bus bar and the negative electrode bus bar are fixed to the insulating resin at a plurality of positions by using the bolts and the nuts. Hence, vibration resistance of the positive electrode bus bar and the negative electrode bus bar can be improved. Hence, stress due to the vibration is not more easily applied to the connecting parts between the DC bus bars and the power terminals, thereby further improving the reliability of the power conversion apparatus.

In addition, preferably, the nut has a nut end face projecting with respect to the seating face of the seat of the insulating resin, and the nut end face is brought into contact with the other of the bus bar groups.

According to the above configuration, since the seat 60 is fastened and fixed to in a state where the bus bars are held by the bolts 85 and the nuts, the bolts are not easily loosened. That is, if the nut end face does not project from the seating face of the seat of the insulating resin, a gap is generated between the DC bus bar and the nut, whereby the bolt is easily loosened when, for example, vibrations are generated. However, as described above, the nut end face projects from the seating face of the seat of the insulating resin, and the bus bar is brought into contact with the nut end face, thereby eliminating the gap between the DC bus bar and the nut end face. Hence, the bus bar can be fixed in a state where the bus bar is held between the bolts and the nuts. Therefore, the bolts can be tightly fastened, whereby the bolts are not easily loosened.

In addition, preferably, the positive electrode bus bar is electrically connected to a voltage detecting wire for detecting voltage of the positive electrode bus bar, and one end of the voltage detecting wire is fastened together with the positive electrode bus bar by the bolt which fixes the positive electrode bus to the insulating resin.

In this case, the bolt and the nut for fixing the voltage detecting wire can double as the bolt and the nut for fixing the positive electrode bus bar to the insulating resin. Hence, the bolt and the nut for fixing the voltage detecting wire are not required to be additionally provided, the number of the bolts and the nuts to be used can be decreased. Therefore, the manufacturing cost of the power conversion apparatus can be lowered.

In addition, preferably, the positive electrode bus bar and the negative electrode bus bar configuring the other of the bus bar groups have an identical shape.

In this case, since the bus bars having an identical shape can be used as both the positive electrode bus bar and the negative electrode bus bar, types of components to be used can be decreased. Hence, the manufacturing cost can be lowered, and the attachment process can be facilitated.

In addition, preferably, the insulating resin has an engaging part which engages with an engaged part formed in the other of the bus bar groups, and is configured so that engagement between the engaging part and the engaged part positions the other of the bus bar groups on the seat.

According to the above configuration, when the other bus bar group is mounted on the seats, the positioning operation can be easily performed. Hence, the burden on an operator manufacturing the power conversion apparatus can be reduced.

In addition, preferably, the stacked body is configured by stacking the plurality of semiconductor modules and refrigerant flow paths, through which a refrigerant flows which cools the semiconductor modules, with each other, the positive electrode bus bar and the negative electrode bus bar include a plurality of DC terminal connecting parts to be respectively connected to the power terminals of the plurality of semiconductor modules arranged in the stacked direction of the stacked body, the distance between the DC terminal connecting parts adjacent to each other in the stacked direction is larger than the width in the stacked direction of the DC terminal connecting part, each of the positive electrode bus bar and the negative electrode bus includes two of the engaged parts, and the engaged parts are formed so as to have hole shapes into which the engaging parts are fitted.

In this case, the step of connecting the positive electrode bus bar and the negative electrode bus bar to the power terminals can easily be performed. That is, as described above, when the distance between the DC terminal connecting parts adjacent to each other in the stacked direction Is large, the DC terminal connecting part can be easily inserted between the power terminals adjacent to each other in the stacked direction, and the DC bus bars can be mounted on the seat, without precisely positioning the DC bus bars. Then, after the seat is mounted, the DC bus bars are moved on the seat so that the engaging parts are engaged with the engaged parts, whereby the positioning operation can be performed. Therefore, the positive electrode bus bar and the negative electrode bus bar can be easily attached to the insulating resin.

As described above, since the DC bus bars can be positioned after the DC bus bars are mounted on the seat, the operation for fitting the engaging parts into the engaged parts is not difficult even when the engaged parts have hole shapes. Hence, the engaged parts have hole shapes can be used, which enables to provide two engaged parts for each of the DC bus bars. Therefore, the positioning operation can be easily performed.

In addition, preferably, a plurality of positioning parts including a pair of the engaging part and the engaged part are formed, a part of the plurality of positioning parts is a small margin positioning part in which the clearance between the engaging part and the engaged part is relatively small, and the other positioning parts are large margin positioning parts in which the clearance between the engaging part and the engaged part is relatively large.

According to the above configuration, the step of mounting the other bus bar group on the seats can easily be performed. That is, when mounting the other bus bar group on the seats by using the above configuration, an operator does not simultaneously perform engagement of all the positioning parts, but performs engagement of the small margin positioning part first. Hence, the other bus bar group can be precisely positioned with respect to the seats. In addition, since the large margin positioning parts have relatively large clearance between the engaging part and the engaged part. Hence, when the engagement of the small margin positioning part has performed once, the large margin positioning parts, which have not been engaged, can easily be engaged.

In addition, according to the above configuration, even when the shapes of the bus bars or the seats varies according to the processing, dimension errors can be canceled in the large margin positioning part, whereby the engaging part and the engaged part can be reliably engaged with each other.

In addition, according to the above configuration, even when the bus bar and the seat are thermally expanded, the difference of thermal expansion can be canceled in the large margin positioning part, whereby excess stress can be prevented from being generated between the engaging part and the engaged part.

It will be appreciated that the present invention is not limited to the configurations described above, but any and all modifications, variations or equivalents, which may occur to those who are skilled in the art, should be considered to fall within the scope of the present invention.

What is claimed is:

1. A power conversion apparatus, comprising:
a plurality of semiconductor modules which have a body part incorporating a switching element configuring a power conversion circuit, and in which power terminals, which conduct electricity to the switching element, project from the body part; and
a plurality of bus bars to which the power terminals are connected; wherein
the plurality of power terminals include a positive electrode power terminal, a negative electrode power terminal, and an AC power terminal, the positive electrode power terminal being electrically connected to a positive electrode of a DC power source, the negative electrode power terminal being electrically connected to a negative electrode of the DC power source, and the AC power terminal being electrically connected to an AC load,
the plurality of bus bars include a positive electrode bus bar, a negative electrode bus bar, and a plurality of AC bus bars, the positive electrode bus bar being connected to the positive electrode power terminal, the negative electrode bus bar being connected to the negative electrode power terminal, and the plurality of AC bus bars being connected to the AC power terminal,
a DC bus bar group includes the positive electrode bus bar and the negative electrode bus bar, an AC bus bar group includes the plurality of AC bus bars, a part of one of the bus bar groups is sealed with an insulating resin, and the other of the bus bar groups is not sealed with the insulating resin,
a seat is formed on the insulating resin sealing the one of the bus bar groups, and the other of the bus bar groups is mounted on a seat face of the seat,
the one of the bus bar groups is the AC bus bar group, and the other of the bus bar groups is the DC bus bar group, and
the positive electrode bus bar and the negative electrode bus bar configuring the other of the bus bar groups have through-holes penetrating in the thickness direction thereof, a plurality of nuts opened from the seat face of the seat are inserted into the insulating resin at positions corresponding to the through-holes, and the other of the bus bar groups is fixed to the insulating resin by inserting bolts into the through-holes and screwing the bolts into the nuts.

2. The power conversion apparatus according to claim 1, wherein each of the positive electrode bus bar and the negative electrode bus bar is formed with a plurality of the through-hole.

3. The power conversion apparatus according to claim 1, wherein the nut has a nut end face projecting with respect to the seating face of the seat of the insulating resin, and the nut end face is brought into contact with the other of the bus bar groups.

4. The power conversion apparatus according to claim 1, wherein the positive electrode bus bar is electrically connected to a voltage detecting wire for detecting voltage of the positive electrode bus bar, and one end of the voltage detecting wire is fastened together with the positive electrode bus bar by the bolt which fixes the positive electrode bus to the insulating resin.

5. A power conversion apparatus, comprising:
a plurality of semiconductor modules which have a body part incorporating a switching element configuring a power conversion circuit, and in which power terminals, which conduct electricity to the switching element, project from the body part; and
a plurality of bus bars to which the power terminals are connected; wherein
the plurality of power terminals include a positive electrode power terminal, a negative electrode power terminal, and an AC power terminal, the positive electrode power terminal being electrically connected to a positive electrode of a DC power source, the negative electrode power terminal being electrically connected to a negative electrode of the DC power source, and the AC power terminal being electrically connected to an AC load,
the plurality of bus bars include a positive electrode bus bar, a negative electrode bus bar, and a plurality of AC bus bars, the positive electrode bus bar being connected to the positive electrode power terminal, the negative electrode bus bar being connected to the negative electrode power terminal, and the plurality of AC bus bars being connected to the AC power terminal,
a DC bus bar group includes the positive electrode bus bar and the negative electrode bus bar, an AC bus bar group includes the plurality of AC bus bars, a part of one of the bus bar groups is sealed with an insulating resin, and the other of the bus bar groups is not sealed with the insulating resin,
a seat is formed on the insulating resin sealing the one of the bus bar groups, and the other of the bus bar groups is mounted on a seat face of the seat,
the one of the bus bar groups is the AC bus bar group, and the other of the bus bar groups is the DC bus bar group,
the insulating resin has an engaging part which engages with an engaged part formed in the other of the bus bar groups, and is configured so that engagement between the engaging part and the engaged part positions the other of the bus bar groups on the seat, and
a stacked body is configured by stacking the plurality of semiconductor modules and refrigerant flow paths, through which a refrigerant flows which cools the semiconductor modules, with each other, the positive electrode bus bar and the negative electrode bus bar include a plurality of DC terminal connecting parts to be respectively connected to the power terminals of the plurality of semiconductor modules arranged in a stacked direction of the stacked body, the distance between the DC terminal connecting parts adjacent to each other in the stacked direction is larger than the width in the stacked direction of the DC terminal connecting part, each of the positive electrode bus bar and the negative electrode bus includes two of the engaged parts, and the engaged parts are formed so as to have hole shapes into which the engaging parts are fitted.

6. A power conversion apparatus, comprising:
a plurality of semiconductor modules which have a body part incorporating a switching element configuring a power conversion circuit, and in which power terminals, which conduct electricity to the switching element, project from the body part; and
a plurality of bus bars to which the power terminals are connected; wherein
the plurality of power terminals include a positive electrode power terminal, a negative electrode power terminal, and an AC power terminal, the positive electrode power terminal being electrically connected to a positive electrode of a DC power source, the negative electrode power terminal being electrically connected to a negative electrode of the DC power source, and the AC power terminal being electrically connected to an AC load,
the plurality of bus bars include a positive electrode bus bar, a negative electrode bus bar, and a plurality of AC bus bars, the positive electrode bus bar being connected to the positive electrode power terminal, the negative electrode bus bar being connected to the negative electrode power terminal, and the plurality of AC bus bars being connected to the AC power terminal, a DC bus bar group includes the positive electrode bus bar and the negative electrode bus bar, an AC bus bar group includes the plurality of AC bus bars, a part of one of the bus bar groups is sealed with an insulating resin, and the other of the bus bar groups is not sealed with the insulating resin, a seat is formed on the insulating resin sealing the one of the bus bar groups, and the other of the bus bar groups is mounted on a seat face of the seat, the one of the bus bar groups is the AC bus bar group, and the other of the bus bar groups is the DC bus bar group, the insulating resin has an engaging part which engages with an engaged part formed in the other of the bus bar groups, and is configured so that engagement between the engaging part and the engaged part positions the other of the bus bar groups on the seat, and a plurality of positioning parts including a pair of the engaging part and the engaged part are formed, a part of the plurality of positioning parts is a first margin positioning part having a clearance between the engaging part and the engaged part, and the other positioning parts are second margin positioning parts in which the clearance between the engaging part and the engaged part is larger than the clearance between the engaging part and the engaged part of the first margin positioning part.

\* \* \* \* \*